United States Patent
Padmanabhan et al.

(10) Patent No.: US 9,502,550 B2
(45) Date of Patent: Nov. 22, 2016

(54) HIGH ELECTRON MOBILITY SEMICONDUCTOR DEVICE AND METHOD THEREFOR

(71) Applicant: SEMICONDUCTOR COMPONENTS INDUSTRIES, LLC, Phoenix, AZ (US)

(72) Inventors: Balaji Padmanabhan, Tempe, AZ (US); John Michael Parsey, Jr., Phoenix, AZ (US); Ali Salih, Mesa, AZ (US); Prasad Venkatraman, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/814,106

(22) Filed: Jul. 30, 2015

(65) Prior Publication Data
US 2015/0340482 A1    Nov. 26, 2015

Related U.S. Application Data

(62) Division of application No. 14/203,299, filed on Mar. 10, 2014, now Pat. No. 9,129,889.

(60) Provisional application No. 61/786,570, filed on Mar. 15, 2013.

(51) Int. Cl.
*H01L 29/00* (2006.01)
*H01L 29/778* (2006.01)
*H01L 29/06* (2006.01)
*H01L 29/423* (2006.01)
*H01L 27/12* (2006.01)
(Continued)

(52) U.S. Cl.
CPC ........ *H01L 29/7783* (2013.01); *H01L 21/845* (2013.01); *H01L 27/0688* (2013.01); *H01L 27/0886* (2013.01); *H01L 27/1211* (2013.01); *H01L 29/045* (2013.01); *H01L 29/0615* (2013.01); *H01L 29/0657* (2013.01); *H01L 29/2003* (2013.01); *H01L 29/205* (2013.01); *H01L 29/402* (2013.01); *H01L 29/4236* (2013.01); *H01L 29/66431* (2013.01); *H01L 29/66462* (2013.01); *H01L 29/66795* (2013.01); *H01L 29/778* (2013.01); *H01L 29/7786* (2013.01); *H01L 29/7787* (2013.01); *H01L 29/7789* (2013.01); *H01L 29/785* (2013.01); *H01L 29/404* (2013.01); *H01L 29/4175* (2013.01); *H01L 29/41791* (2013.01); *H01L 29/42316* (2013.01); *H01L 29/42376* (2013.01)

(58) Field of Classification Search
CPC .......... H01L 29/785; H01L 29/66795; H01L 21/845; H01L 27/1211; H01L 27/0688; H01L 27/0886
See application file for complete search history.

(56) References Cited

U.S. PATENT DOCUMENTS 7,439,555 B2    10/2008  Beach et al.
7,671,420 B2 *   3/2010  Shin ................ H01L 21/823807
                                                          257/255
(Continued)

*Primary Examiner* — Ngan Ngo
(74) *Attorney, Agent, or Firm* — Kevin B. Jackson

(57) ABSTRACT

In one embodiment, Group III-nitride materials are used to form a semiconductor device. A fin structure is formed in the Group III-nitride material, and a gate structure, source electrodes and drain electrodes are formed in spaced relationship to the fin structure. The fin structure provides both polar and semi-polar 2DEG regions. In one embodiment, the gate structure is configured to control current flow in the polar 2DEG region. Shield conductor layers are included above the gate structure and in spaced relationship with drain regions of the semiconductor device.

20 Claims, 16 Drawing Sheets

(51) Int. Cl.
*H01L 27/088* (2006.01)
*H01L 27/06* (2006.01)
*H01L 29/78* (2006.01)
*H01L 21/84* (2006.01)
*H01L 29/66* (2006.01)
*H01L 29/40* (2006.01)
*H01L 29/04* (2006.01)
*H01L 29/20* (2006.01)
*H01L 29/205* (2006.01)
*H01L 29/417* (2006.01)

(56) References Cited

U.S. PATENT DOCUMENTS

| | | | |
|---|---|---|---|
| 7,799,592 B2 | 9/2010 | Lochtefeld | |
| 8,183,627 B2 | 5/2012 | Currie | |
| 9,129,889 B2 * | 9/2015 | Padmanabhan | H01L 29/7787 |
| 2005/0274977 A1 | 12/2005 | Saito et al. | |
| 2006/0193088 A1 | 8/2006 | Gurney et al. | |
| 2006/0197129 A1 | 9/2006 | Wohlmuth | |
| 2008/0299734 A1 * | 12/2008 | Lee | H01L 29/66818 |
| | | | 438/300 |
| 2009/0146243 A1 * | 6/2009 | Lee | H01L 29/78 |
| | | | 257/506 |
| 2010/0015815 A1 * | 1/2010 | Shiozawa | H01L 21/02238 |
| | | | 438/772 |
| 2011/0233521 A1 | 9/2011 | Saxler | |
| 2012/0217512 A1 | 8/2012 | Renaud | |
| 2012/0223319 A1 | 9/2012 | Dora | |
| 2013/0221434 A1 | 8/2013 | Okada et al. | |
| 2014/0141595 A1 | 5/2014 | Babic et al. | |
| 2016/0163918 A1 * | 6/2016 | Dasgupta | H01L 33/16 |
| | | | 257/13 |

* cited by examiner

HIGH ELECTRON MOBILITY SEMICONDUCTOR DEVICE AND METHOD THEREFOR

CROSS REFERENCE TO RELATED APPLICATION

This application is a divisional application of U.S. patent application Ser. No. 14/203,299 filed on Mar. 10, 2014 and issued as U.S. Pat. No. 9,129,889 on Sep. 8, 2015, which claims the benefit of U.S. Provisional Application No. 61/786,570 filed Mar. 15, 2013.

BACKGROUND

The present invention relates, in general, to electronics, and more particularly, to semiconductors, structures thereof, and methods of forming semiconductor devices.

In the past, the semiconductor industry utilized various device structures and methods to form semiconductor devices that used Group III-nitride structures, such as gallium nitride (GaN), as one of the semiconductor materials. Group III-nitride semiconductors have been known to exhibit a large dielectric breakdown field of greater than 3.0 MV/cm. Also, Group III-nitride heterojunction structures have been capable of carrying a very high current, which has made some devices fabricated in the Group III-nitride material system appropriate for high power-high frequency applications.

The devices fabricated for these types of applications have been based on general device structures that exhibit high electron mobility and have been referred to variously as heterojunction field effect transistors (HFETs), high electron mobility transistors (HEMTs), or modulation doped field effect transistors (MODFETs). These types of devices typically were able to withstand high voltages, such as in the range of 100 Volts, while operating at high frequencies, typically in the range of 1-100 GHz. These types of devices have been modified for a number of types of applications, but typically GaN-based devices have operated through the use of piezoelectric polarization fields to generate a two dimensional electron gas (2DEG) region that has allowed transport of very high current densities with lower resistive losses.

Previous HEMT devices have utilized trench structures formed in an active area of the transistor. Portions of the trenches were utilized as the gate regions of the transistor. One problem with such prior transistors was the on resistance characteristics were too high. Efforts to reduce the on resistance typically resulted in significant increases in manufacturing costs. Also, other prior transistors had a high source inductance and further had a source configuration that increased difficulty in integrating the transistors together for various applications.

Accordingly, it is desirable to have a semiconductor device and a method of forming the semiconductor device that uses GaN or other Group III-nitride series materials, which has a lower on-resistance, a lower cost of manufacture, a reduced source inductance, and/or an improved structure for integration with other devices.

Figure 1:
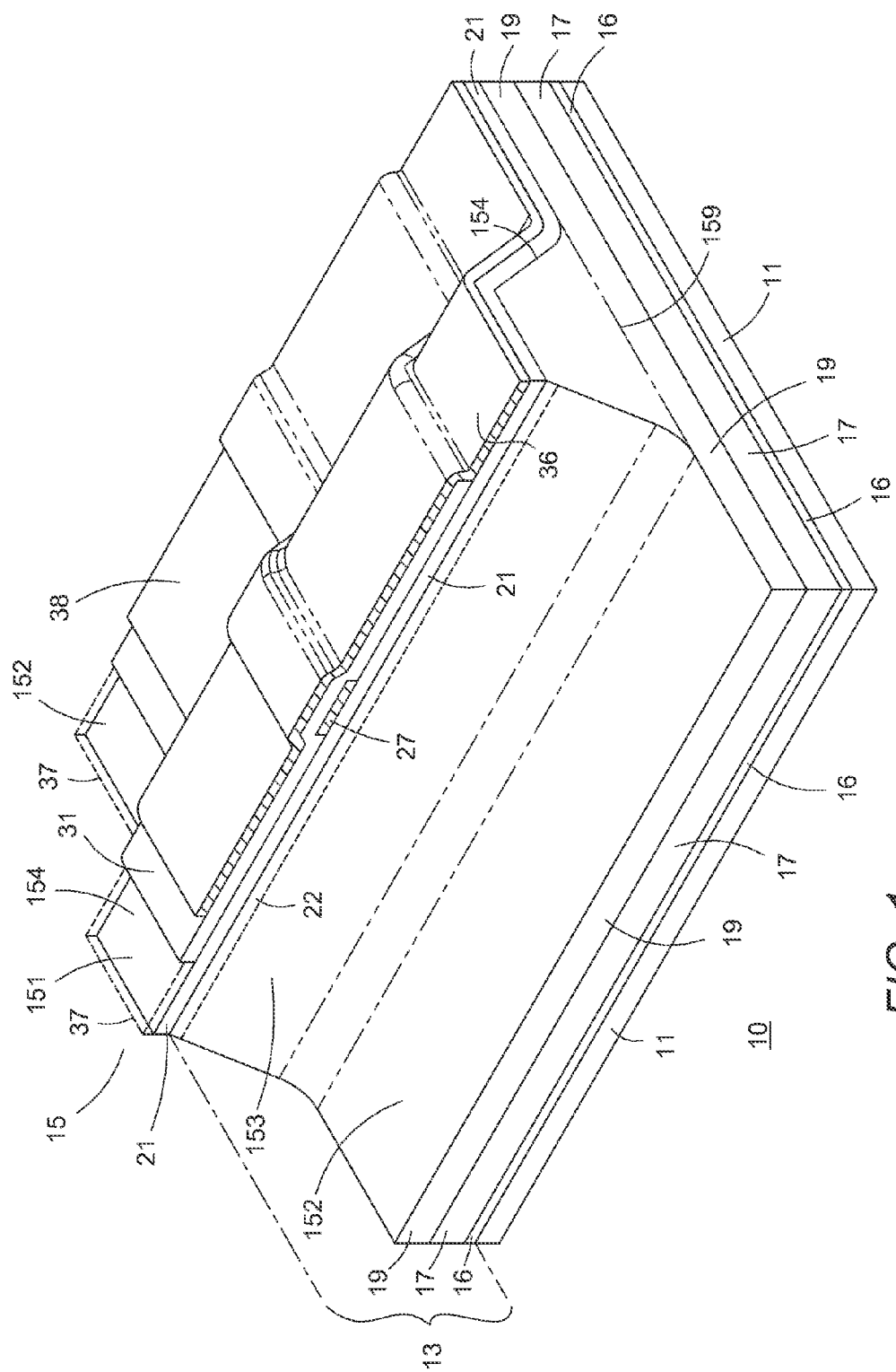
FIG. 1 illustrates an enlarged perspective and cross-sectional view of an embodiment of a semiconductor device in accordance with the present invention.

For simplicity and clarity of the illustration(s), elements in the figures are not necessarily to scale, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. Also, the devices explained herein can be Ga-face GaN devices or N-face GaN devices. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles. Additionally, it is to be understood that where it is stated herein that one layer or region is formed on or disposed on a second layer or another region, the first layer may be formed or disposed directly on the second layer or there may be intervening layers between the first layer and the second layer. Further, as used herein, the term formed on is used with the same meaning as located on or disposed on and is not meant to be limiting regarding any particular fabrication process.

Moreover, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

In general, the present embodiments relate to a semiconductor device structure and a method of forming the structure including a high electron mobility transistor (HEMT). The HEMT device structure includes a base semiconductor substrate and a heterostructure associated with the base substrate. The heterostructure comprises materials having hexagonal crystal structures, such as the wurtzite crystal structure. In some embodiments, the heterostructure is a Group III-nitride series material such as gallium nitride (GaN), aluminum gallium nitride (AlGaN), indium nitride (InN), aluminum nitride (AlN), indium gallium nitride (InGaN), indium aluminum gallium nitride (InAlGaN), combinations of two or more of the foregoing materials, or similar materials as known to those of ordinary skill in the art.

In some embodiments, the HEMT device includes a substrate of a first material type. A first semiconductor region of a Group III-nitride material is on a first surface of the substrate and includes a first fin structure or elongated ridge portion. In some embodiments, the first fin structure includes a generally horizontal first top surface, a recessed surface portion adjacent the first top surface and first sidewall surfaces that extend between the recessed surface portion and the first top surface. The first sidewall surfaces are sloped so that a base portion of the first fin structure is wider than the first top surface. A second semiconductor region of a Group III-nitride material is on the first semiconductor region and in some embodiments, a gate conductor overlies at least part of the recessed surface portion and in other embodiments the gate conductor also wraps around the fin structure. In some embodiments, a first current carrying electrode is electrically coupled to the second semiconductor region along at least the first top surface, and a shield conductor above and insulated from the gate conductor. Among other things, the channel of the HEMT device can form around the surface of the fin structure, which increases the channel density of the HEMT device.

In other embodiments, the HEMT device structure includes a substrate of a first material type, the substrate having a first major surface and a second major surface. A first semiconductor region of a second material type is disposed on the first major surface of the substrate. A first trench extends into the first semiconductor region, the first trench having sidewalls and a bottom surface. A second semiconductor region of a third material type is disposed on the first semiconductor region and within the first trench, wherein the second semiconductor region is configured to form a 2DEG region that is semi-polar proximate to the sidewalls of the first trench and polar proximate to the bottom surface of the first trench. In one embodiment, a control electrode is within the first trench and configured to control at least a horizontal or lateral portion of the 2DEG region (that is, a polar portion thereof). In other embodiments, the control electrode can be along the sidewall surfaces of the trench and configured to control the adjacent semi-polar 2DEG region. A shield conductor layer is within the trench and above the control electrode and separated from the control electrode by an insulating layer. A first current carrying electrode is electrically coupled to 2DEG region. The embodiments provide, among other things, reduced on-resistance, reduced cost of manufacture, reduced source inductance, and/or an improved structure for integration with other devices.

Turning now to the drawings, FIG. 1 illustrates an enlarged perspective and cross-sectional view of an embodiment of a semiconductor device 10 configured in the present embodiment as a Group III-nitride high electron mobility transistor (HEMT) having a fin structure or elongated ridge structure 15, which advantageously has reduced on resistance and a lower cost of manufacturing. Transistor 10 is sometimes referred to as a heterostructure FinFET. In one embodiment, transistor 10 includes a fin structure 15 of GaN bulk material (for example, GaN layer 19) over which is formed a barrier layer, such as AlGaN layer 21, and the polarization property of the materials induces a two dimensional electron gas channel (2DEG) 22 in GaN layer 19 close to the interface between the layers.

Transistor 10 includes a base substrate, substrate, base semiconductor substrate, a region of semiconductor material, semiconductor region, or semiconductor substrate 11. In several embodiments, substrate 11 is a silicon substrate having a (111) crystal orientation and is doped with a p-type dopant, such as boron, or substrate 11 can be undoped or intrinsically doped. In other embodiments, substrate 11 can have other orientations. In other embodiments, substrate 11 can be silicon-carbide, GaN, AlN, other semiconductor materials, sapphire, other insulating materials, or other materials as known to those of ordinary skill in the art. In other embodiments, substrate 11 can be doped with an n-type dopant such as phosphorus, arsenic, or antimony.

Transistor 10 also includes a heterostructure, epitaxial structure, or first semiconductor region 13, which can be formed on substrate 11. In several embodiments, heterostructure 13 includes a plurality of layers including, for example, a nucleation or buffer layer 16; one or more buffer or transition layers or transition structure 17 (which can be optional in some embodiments); and a first semiconductor region, first layer, channel-forming layer, or channel layer 19. In some embodiments, buffer layer 16 can be, for example, an AlN layer, situated over substrate 11. In some embodiments, transition layers 17 can be, for example, AlGaN with varying amounts of aluminum concentration. For example, the aluminum concentration can be higher in the transition layers 17 closer to buffer layer 16 and lower closer to channel layer 19. Channel layer 19 can be formed situated on transition layers 17. In several embodiments, channel layer 19 can be, for example, a GaN layer. Substrate 11 with heterostructure 13 can be manufactured by semiconductor wafer suppliers, such as EpiGaN of Hasselt, Belgium.

In some embodiments, fin structure 15 is formed within channel layer 19 and includes a generally horizontal top surface 151, a recessed surface portion 152, and sidewall surfaces 153 and 154 extending between recessed surface portion 152 and top surface 151. In other embodiments, as will be described later, fin structure 15 can be formed in transition layer structure 17. In accordance with the present embodiment, sidewall surfaces 153 and 154 are sloped such that a base portion 159 of fin structure 15 is wider than top surface 151. In accordance with the present embodiment, sidewall surfaces 153 and 154 are formed along the $\{01\bar{1}2\}$ family R-plane of heterostructure 13, which provides a semi-polar surface proximate to sidewall surfaces 153 and 154 when barrier layer 21 (described below) is formed on channel layer 19. In accordance with the present embodiment, sidewall surfaces 153 and 154 preferably are not formed along the A-plane or the M-plane of heterostructure 13, which exhibit a nonpolar characteristic when barrier layer 21 is formed over channel layer 19. Top surface 151 is formed along <0001> C axis (close packed) basal plane of heterostructure 13, which provides a polar surface proximate to top surface 151 when barrier layer 21 is formed over channel layer 19.

In some embodiments, a second layer, a second semiconductor region, a barrier layer, or a Schottky layer 21 is formed over channel layer 19 including fin structure 15. A portion of barrier layer 21 is illustrated in cross-sectional form in FIG. 1, and it is understood that barrier layer 21 can extend to further overlie sidewall surface 153 and recessed surface portion 152. In some embodiments, barrier layer 21 can be an AlGaN layer formed over channel layer 19. At the interface of the barrier layer 21 and the channel layer 19 a two-dimensional electron gas (2DEG) layer or region 22 is formed, as known to those of ordinary skill in the art. Therefore, a channel is formed around fin structure 15, which increases the channel density of transistor 10 and improves on resistance. In other embodiments of transistor, an AlN layer (not shown) can be placed in between channel layer 19 and barrier layer 21. The AlN layer is advantageous in that it increases the 2DEG channel density. Also, AlN is a higher band gap material that restricts the electrons within the 2DEG region from entering into barrier layer 21, which reduces alloy disorder scattering and thus, enhances mobility. In some embodiments of transistor 10, a cap layer or layers (for example, GaN, AlN) can be included over barrier layer 21. Heterostructure 13 and barrier layer 21 can be formed using a metal-organic vapor phase epitaxy (MOVPE) process (also known as organo-metallic vapor phase epitaxy (OMVPE) or metal-organic chemical vapor deposition (MOCVD)), which is a chemical vapor deposition method used to produce single crystalline or polycrystalline thin films. Due to the crystal orientation of heterostructure 13, the thickness of barrier layer 21 can be thicker along sidewall surfaces 153 and 154. When gate electrode 27 is wrapped around fin structure 15, this configuration provides for a different but acceptable threshold voltage on sidewall surfaces 153 and 154 compared to top surface 151. This results at least in part from the semi-polar characteristics of the $\{01\bar{1}2\}$ family R-plane of heterostructure 13 along sidewall surfaces 153 and 154 compared to the polar characteristics of the <0001> C axis (close packed) basal plane of heterostructure 13 along top surface 151 and recessed surface portion 152.

In some embodiments, transistor 10 has a gate structure, which can include a control electrode, gate conductor, or gate electrode 27, situated over barrier layer 21, and can be, for example, aluminum with a titanium and/or titanium-nitride barrier or other conductive materials as known to those of ordinary skill in the art. A portion of gate electrode 27 is illustrated in cross-sectional form in FIG. 1, and it is understood that gate electrode 27 can extend to further overlie sidewall surface 153 and recessed surface portion 152. In some embodiments, transistor 10 can utilize gate electrode 27 configured as a Schottky gate structure as illustrated in FIG. 1. In other embodiments, the gate structure of transistor 10 can be configured with a gate dielectric region (for example, gate dielectric layer 26 illustrated in FIG. 2) between barrier layer 21 and gate electrode 27. In some embodiments, the gate dielectric region can be silicon nitride aluminum nitride, aluminum oxide, silicon oxide or combinations thereof, hafnium oxide, or other materials as known to those of ordinary skill in the art. The gate dielectric region can be formed in-situ with layers 16-21 or it can be deposited after barrier layer 21 is formed. In other embodiments, gate electrode 27 can include gate field plate structures, such as stepped or tiered gate field plate structures or planar field plate gate structures. Such gate field plate structures can be configured to control the electric field build-up in 2DEG region 22 proximate to gate electrode 27 when a large voltage is applied to the drain of transistor 10. In further embodiments, dual gate structures can be used for switching or logic applications.

In one embodiment, a passivation, insulation, or insulating layer 31 is formed over gate electrode 27. In some embodiments, insulating layer 31 can be one or more of silicon nitride, aluminum nitride, silicon oxide combinations thereof, or other insulating materials as known to those of ordinary skill in the art. In some embodiments, insulating layer 31 can be silicon nitride formed using plasma-enhanced chemical vapor deposition techniques (PECVD), low pressure chemical vapor deposition (LPCVD), MOCVD, atomic layer deposition (ALD), and can have a thickness from about 0.01 microns to about 1.0 micron. In other embodiments, insulating layer 31 can have a thickness from about 0.1 microns to about 0.5 microns. A portion of insulating layer 31 is illustrated in cross-sectional form in FIG. 1, and it is understood that insulating layer 31 can extend to further overlie sidewall surface 153 and recessed surface portion 152.

Transistor 10 further includes ohmic contacts, electrodes, or current carrying electrodes 36 and 37, which are spaced apart and make contact to barrier layer 21 and/or channel layer 19 proximate to 2DEG region 22 along recessed surface portion 152, sidewall surfaces 153 and 154, and top surface 151. Portions of electrodes 36 and 37 are illustrated in cross-sectional form in FIG. 1, and it is understood that electrodes 36 and 37 can extend to further overlie sidewall surface 153 and recessed surface portion 152. Electrode 37 is illustrated in phantom to show portions of fin structure 15 underneath. Electrodes 36 and 37 can be a conductive material configured to provide an ohmic contact to or proximate to 2DEG layer 22 by contacting, for example, either channel layer 19, contacting barrier layer 21, or portions of both layers. In some embodiments, electrodes 36 and 37 can be any suitable conductive structures, such as titanium, titanium nitride, aluminum, nickel, platinum, gold, tungsten, or combinations thereof. In one embodiment, electrodes 36 and 37 can be a laminate metal structure, for example, titanium/aluminum/titanium/titanium-nitride. In some embodiments, electrode 37 is configured as a drain electrode and electrode 36 is configured as a source electrode with gate electrode 27 in between electrodes 36 and 37 as generally illustrated in FIG. 1. In some embodiments, gate electrode 27 is placed closer to source electrode 36 (that is, spaced further apart from electrode 37). In other embodiments, the structure is used as a Schottky diode with electrode 36 configured as an anode electrode and electrode 37 configured as a cathode electrode, or vice versa. In some embodiments of the Schottky diode, shield conductor layer 38 is included and is connected to the anode electrode.

In some embodiments, transistor 10 further includes one or more shield conductor layers 38, which can be formed over the structure to support the reverse drain voltage applied to the device. A portion of shield conductor layer 38 is illustrated in cross-sectional form in FIG. 1, and it is understood that shield conductor layer 38 can extend to further overlie sidewall surface 153 and recessed surface portion 152. In some embodiments that use more than one shield conductor layers 38, the multiple shield conductor layers can be separated by additional insulating materials such as the materials described for insulating layer 31. In some embodiments, shield conductor layer 38 may be connected to source electrode 36. In other embodiments, shield conductor layer 38 can be configured to be independently biased or can be floating.

In accordance with the present embodiment, 2DEG region 22 forms around fin structure 15 having sloped sidewalls 153 and 154, which increases the channel density of transistor 10 (that is, along horizontal and facetted/slant surfaces of fin structure 15) and thus, reduces the specific on resistance of transistor 10 (that is, lower on resistance for a given die size). This benefit reduces the cost of manufacturing. Further, shield conductor layer 38 is configured to support breakdown voltage reliability of transistor 10.

Figure 2:
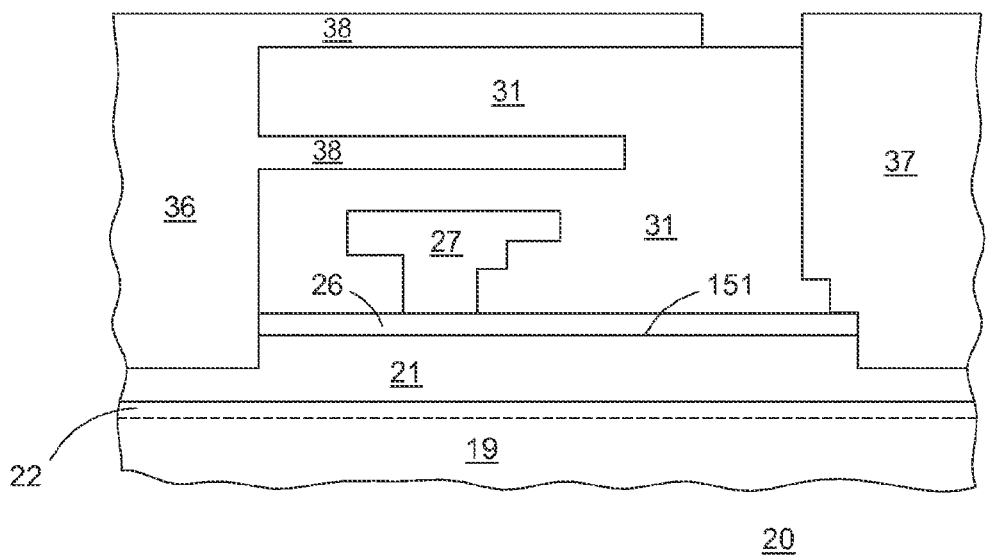
FIG. 2 illustrates an enlarged partial cross-sectional view of a semiconductor device in accordance with another embodiment of the present invention.

FIG. 2 illustrates a partial cross-sectional view of a transistor 20 in accordance with an alternative embodiment. Transistor 20 is similar to transistor 10 with only differences described hereinafter. Transistor 20 is an embodiment where the gate structure includes a gate dielectric layer 26 in between gate electrode 27 and the heterostructure (for example, barrier layer 21). Gate dielectric layer 26 can be silicon nitride, aluminum nitride, aluminum oxide, a silicon oxide or combinations of one or more thereof, hafnium oxide, or other materials as known to those of ordinary skill in the art. Gate electrode 27 in transistor 20 is illustrated as having a stepped or tiered shape to provide a gate electrode field plate structure, which helps reduce the electrical field in 2DEG region 22 proximate to gate electrode 27 on the drain side of transistor 20. In addition, transistor 20 is illustrated with more than one shield conductor layers 38 (that is, multiple levels), which can be connected to source electrode 36. In some embodiments, the upper most extension of the field plate structures extend closer to drain electrode 37 as generally illustrated in FIG. 2. In some embodiments, the multiple levels of shield conductor layer 38 are separated by insulating layer 31 as generally illustrated in FIG. 2.

Figure 3:
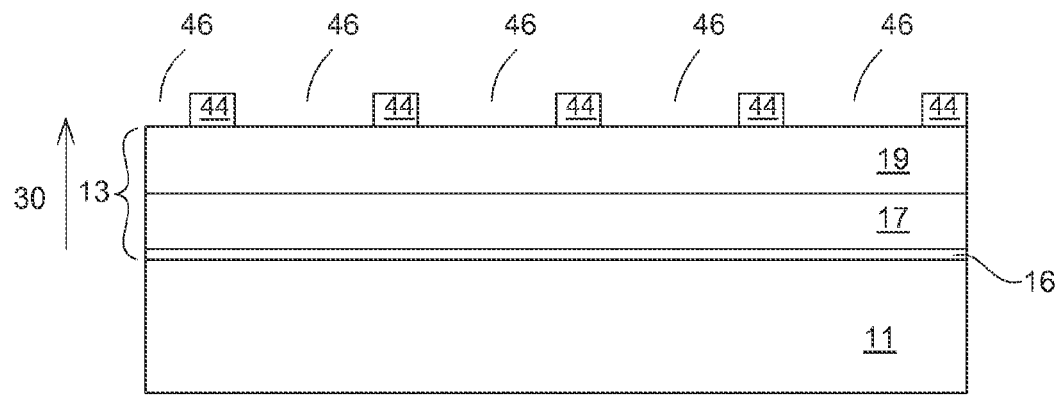
FIGS. 3-5 illustrate enlarged cross-sectional views of the semiconductor device of FIG. 1 at various stages of manufacture in accordance with a method of the present invention.

FIG. 3 illustrates an enlarged partial cross-sectional view of transistor 10 at a stage of fabrication. In FIG. 3, substrate 11 having heterostructure 13 is provided. In accordance with the present embodiment, heterostructure 13 is formed along <0001> C axis (close packed) basal plane generally represented by arrow 30. In one embodiment, substrate 11 can be a silicon substrate having (111) orientation and can have a p-type conductivity or can be undoped. In alternative embodiments, substrate 11 can be GaN, sapphire, SiC, or other materials known to those of ordinary skill in the art. In one embodiment, heterostructure 13 can be a Group III-nitride structure where nucleation layer 16 can be AlN and buffer layer 17 can be a plurality of AlGaN layers having lower aluminum concentration as buffer layer 17 approaches layer 19. In accordance with the present embodiment, buffer layer 17 and/or layer 19 have a thickness sufficient to support the etched structure that will be subsequently formed depending upon which of the two layers will support the etched structure. In some embodiments, the layer configured to support the etched structure has a thickness from about 0.5 microns to about 30 microns. In other embodiments, the layer configured to support the etched structure has a thickness from about 0.5 to about 3 microns.

Figure 6A:
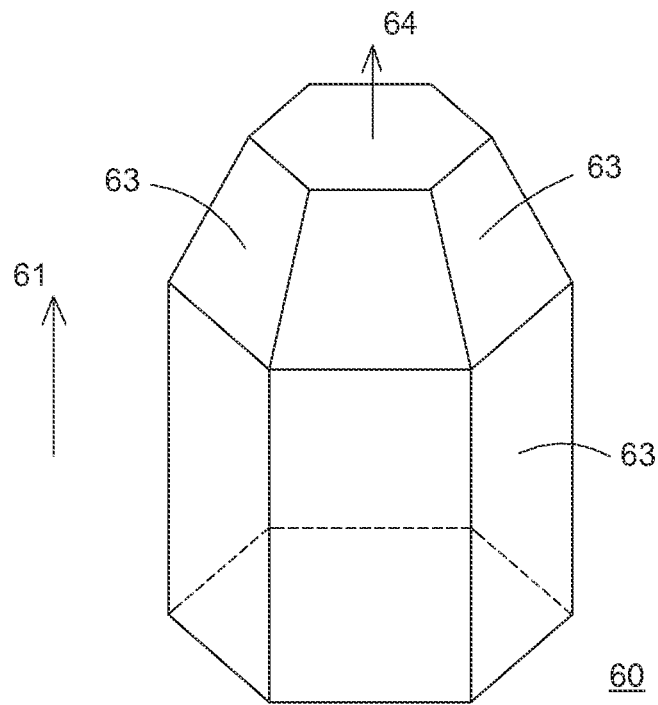
FIG. 6A schematically illustrates relevant crystal planes of a heterostructure used in the semiconductor devices of FIGS. 1, 7-26 in accordance with the present invention.

In other embodiments, buffer layer 17 can be a combination of GaN/AlGaN layers having various combinations and compositions, super lattice structures (SLS), or other materials as known to one of ordinary skill in the art. In one embodiment, buffer layer 17 has an outermost AlGaN layer having a moderate Al mole fraction (about 10% to about 30% for example) and having a thickness sufficient to support etching of the structured surface. Heterostructure 13 can be formed using a MOCVD or MBE process or methods capable of depositing thin layers. In one embodiment, a masking layer 44 is formed on layer 19 and patterned to provide openings 46 that expose parts of layer 19 for further processing. In one embodiment, masking layer 44 can be a patterned photoresist layer. In one embodiment, the openings 46 can be in the shape of triangles. In accordance with the present embodiment, openings 46 can be aligned to the {01$\bar{1}$2} family R-plane of heterostructure 13 as schematically represented in FIG. 6A, which illustrates the planes of a wurtzite crystal structure 60. Arrow 61 represents the <0001> C axis (close packed) basal plane, reference number 62 represents the {01$\bar{1}$0} M-plane family, reference numbers 63 represent the {01$\bar{1}$2} family R-planes, and reference number 64 represents the <0001> C plane. The {01$\bar{1}$2} family R-plane is moderately polar, not as strongly polar as the <0001> C-planes, but is capable of creating a 2DEG with reduced charge transfer efficiency.

Figure 4:
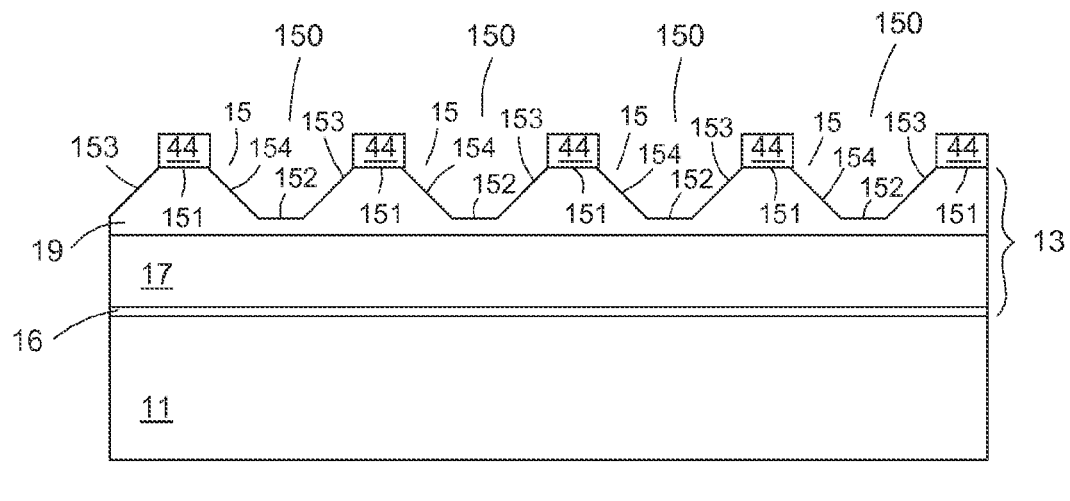

FIG. 4 illustrates an enlarged partial cross-sectional view of transistor 10 at another stage of fabrication. In one embodiment, the exposed surfaces of layer 19 are etched to form etched structures or trenches 150 that can extend across layer 19 so as to, for example, extend out of the plane of the page of FIG. 4. In one embodiment, trenches 150 are formed using an etchant that is selective to close-packed planes. For example, potassium hydroxide (KOH), sodium hydroxide (NaOH), or similar etchant can be used. In one embodiment trenches 150 can have horizontal dimensions in a range from about 5 microns to about 20 microns. In this step, fin structures 15 are formed having top surfaces 151, recessed surface portions 152, and sidewall surfaces 153 and 154, which are formed along the {01$\bar{1}$2} family R-planes. In one embodiment, recessed surface portions 152 are recessed about 0.5 microns to about 30 microns below top surfaces 151 of fin structures 15. As illustrated in FIG. 4, trenches 150 are etched to have sloped sidewalls with the width of trenches 150 decreasing with increased distance into the layer 19. Stated another way, this step provides fin structures 15 with wider base portions 159 compared to top surfaces 151 as generally illustrated in FIG. 1. After fin structures 15 are formed, masking layer 44 can be removed and the surface of heterostructure 13 cleaned to remove any contaminants. Although trenches 150 are illustrated as having generally flat recessed surface portions 152, it is understood that trenches 150 can also be V-shaped, U-shaped, or other shapes.

Figure 5:
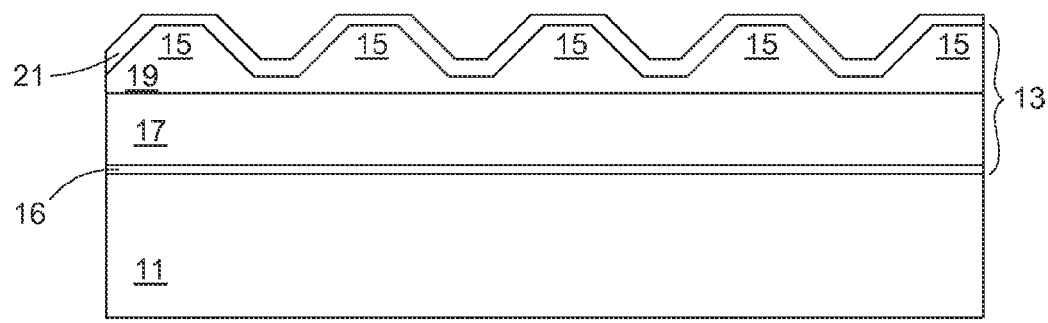

FIG. 5 illustrates an enlarged partial cross-sectional view of transistor 10 at a further stage of fabrication. In one embodiment, layer 21 can be formed on layer 19. In some embodiments, layer 21 can be an AlGaN barrier layer that has a concentration of Al configured to achieve a desired charge density when layer 19 is a GaN channel layer. In one embodiment the Al mole fraction of the AlGaN may be in the range of approximately fifteen to thirty percent (15%-30%). In some embodiments, the AlGaN is conformably formed. In an alternative embodiment when layer 19 comprises AlGaN, layer 21 can be GaN layer conformably formed over layer 19 having a thickness of approximately 50 nanometers (nm) to about 1000 nm. In this embodiment, layer 21 can also include a layer of AlGaN formed on the GaN layer with the AlGaN layer configured as a barrier layer and the GaN layer configured as the channel layer. In other embodiments, layer 21 may further include a capping layer of GaN, AlN, or silicon nitride. Layers 19 and 21 can be formed using MOVPE processes or MOCVD processes. In another embodiment, an AlN layer (not shown) can be formed in between layer 19 and layer 21. It is understood that the method described in conjunction with FIGS. 3-5 can generally be used as part of the fabrication of any of the device embodiments described herein.

Figure 6B:
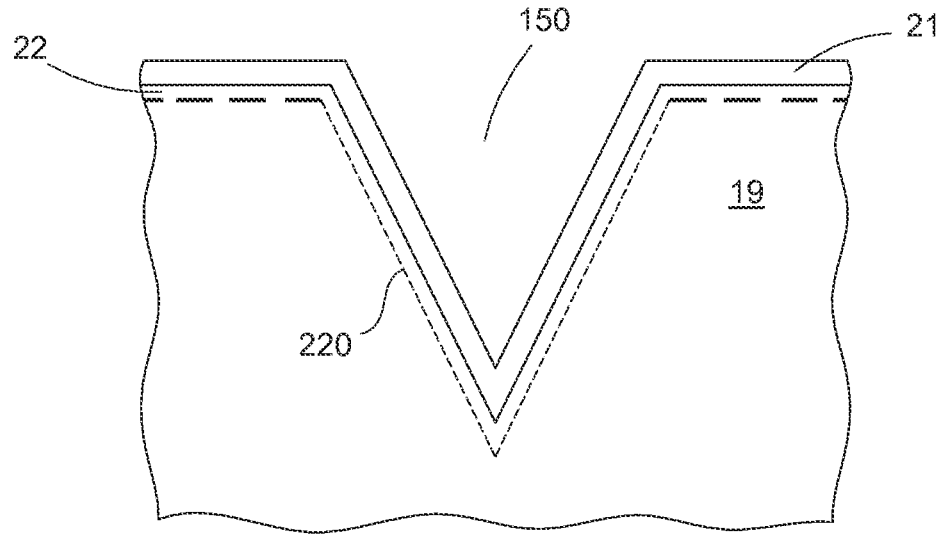
FIG. 6B illustrates an enlarged cross-sectional view of a portion of the semiconductor device of FIG. 1 in accordance with an alternative embodiment of the present invention.

FIG. 6B illustrates an enlarged portion of an embodiment of a channel structure of transistor 10 where trench 150 has a V-shape. As described previously, 2DEG region 22 is formed by the strain at the GaN—AlGaN interface, with charge transfer to the quantum well from the piezoelectric response of the AlGaN layer. In accordance with the present embodiment, 2DEG region 22 has a higher conductivity than 2DEG region 220 because of the semi-polar characteristics of the {01$\overline{1}$2} family R-plane where 2DEG region 220 is formed in transistor 10.

Subsequently, the gate, drain, and source structures are formed as illustrated in FIG. 1 and described previously over the heterostructure to further complete transistor 10. Transistor 10 may be a depletion (D-mode), enhancement (E-mode), or a combination of these devices, which may be created by layer stacking and selectively etching, or P-type and/or N-type doping in the top layers, or by the addition of dielectric layers such as hafnium oxide, aluminum oxide, and other materials, in conjunction with selective etching processes.

Figure 7:
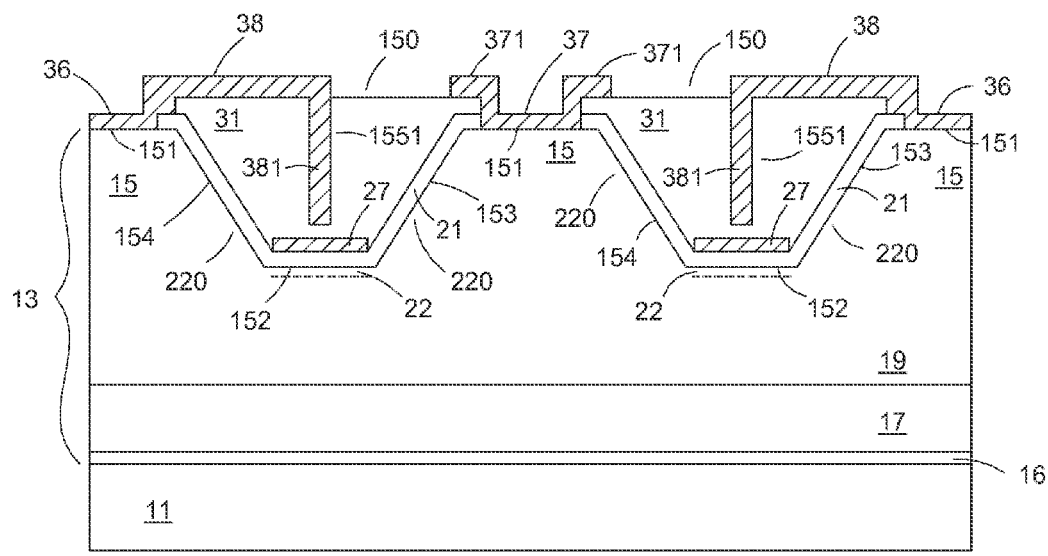
FIGS. 7-26 illustrate enlarged cross-sectional views of portions of semiconductor device in accordance with alternative embodiments of the present invention.

FIG. 7 illustrates an enlarged cross-sectional view of a portion of an embodiment of a semiconductor device, such as a vertical HEMT 70. In one embodiment, transistor 70 includes a gate structure that is formed in a trench, opening, or recessed portion 150 having sloped sidewalls 153 and 154 defining fin structures 15, which are formed along the {01$\overline{1}$2} family R-plane of heterostructure 13. In the present embodiment, trench 150 is formed in or etched into layer 19 of heterostructure 13. Gate conductor 27 of the gate structure is formed proximate to recessed surface portion 152 of trench 150 and overlying a 2DEG region 22 of transistor 70 such that transistor 70 has gate controlled lateral current flow in 2DEG region 22 (which is polar), therefore transistor 70 includes a horizontal or lateral channel. Also, because sidewalls 153 and 154 are formed along the {01$\overline{1}$2} family R-plane of heterostructure 13, transistor 70 also has an angled channel region in 2DEG region 220 that is semi-polar as described previously in transistor 10. In one embodiment, transistor 70 includes channel layer 19 of GaN and bather layer 21 of AlGaN, which is conformably formed over channel layer 19 adjacent sidewall surfaces 153 and 154. Drain electrode 37 is formed on top surface 151 of fin structure 15 and one or more source electrodes 36 are formed on top surfaces 151 of opposing fin structures 15. It is understood that source electrode 36 and/or drain electrode 37 can make contact proximate to 2DEG region 22 along bather layer 21 or channel layer 19. In one embodiment, insulating layers 31 are formed within trenches 150 and further include one or more trenches, vias or openings 1551 that provide for shield conductor layers 38 having a generally vertical portion 381 extending generally downward into trenches 150 as illustrated in FIG. 7. In one embodiment, shield conductor layers 38 are connect to source electrodes 36. In other embodiments, shield conductor layers 38 can be floating or can be independently biased.

The voltage in the drain side of transistor 70 is supported by shield conductor layers 38 on both sides of the drain portion of channel layer 19. Additionally, shield conductor layers 38 help reduce the electric field and can improve the reliability performance of the transistor 70. The configuration of the present embodiment helps in reducing the pitch of the device as the gate to drain distance for supporting the voltage is vertical, which provides for increasing the gate to drain distance without increasing the surface area, and the device area on the surface can be thereby reduced. Also, this configuration increases the packing density of the multiple transistors 70 on a wafer and reduces die cost for a given on resistance (Rdson).

Drain field plates 371 are also shown with drain electrode 37 and are configured to reduce the electric field near the drain region of transistor 70. The source side of the device can be smaller (horizontally in FIG. 7) because the source side does not support any substantial portion of the breakdown voltage, which helps in reducing the pitch of the device. In accordance with the present embodiment, insulating layer 31 in transistor 70 has a varying thickness, which can go from thin to thick as it extends towards the surface of channel layer 19. This is an advantageous equivalent of making a stacked multiple level/multiple layers of shield conductor. In transistor 70, the channel surfaces can be polar (that is, 2DEG region 22) and/or semi-polar planes (that is, 2DEG region 220). In some embodiments, doped regions (not shown) are included in channel layer 19 near the surface of channel 19 or barrier layer 21 adjacent source electrodes 36 and/or drain electrode 37 to provide low resistance contacts between channel layer 19 and the respective electrodes.

In some embodiments of transistor 70, the drain regions in transistor 70 (as well as other transistor structures described herein) can be brought up to and adjoining the upper edges of trenches 150, or the drain regions can be spaced apart from the upper edges of the sidewalls of trenches 150 to reduce the electric field between the drain regions and the shield conductor layers.

Figure 8:
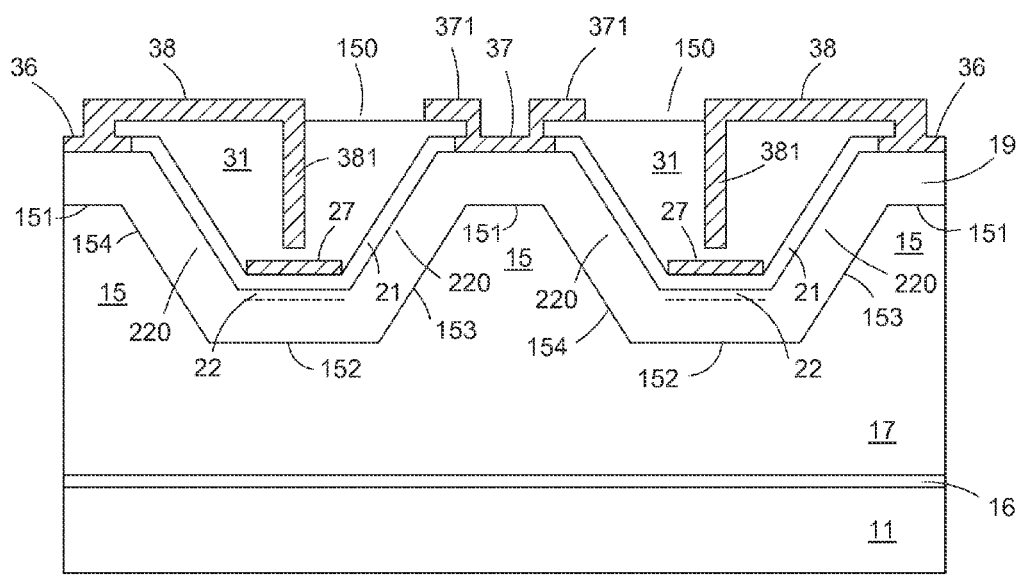

FIG. 8 illustrates an enlarged cross-sectional view of an example of a portion of an embodiment of a semiconductor device, such as HEMT 80, which is an alternate embodiment of transistor 70. Transistor 80 is similar to transistor 70, but transistor 80 includes a thicker buffer layer 17 that is formed with trenches 150 and then channel layer 19 is conformably formed over buffer layer 17 and trenches 150. Barrier layer 21 can then be formed on all or portions of channel layer 19. In this embodiment, channel layer 19 underlying source electrodes 36 and drain electrode 37 can be thinner. In transistor 80, buffer layer 17 is configured to assist in supporting the drain voltage and increasing the breakdown voltage of transistor 80.

Figure 9:
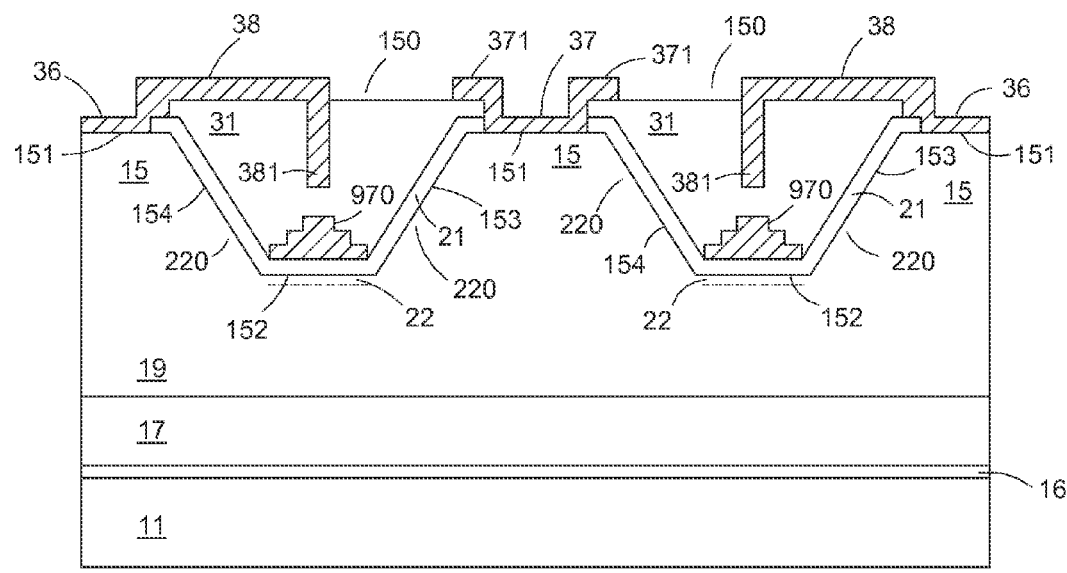

FIG. 9 illustrates an enlarged cross-sectional view of an example of a portion of an embodiment of a semiconductor device, such as HEMT 90, which is an alternate embodiment of transistors 70-80. Transistor 90 may be similar to transistors 70-80, but transistor 90 includes a gate structure having a gate conductor 970 that has a stepped or tiered configuration such that the thickness of the gate conductor decreases in steps for increasing distance from 2DEG region 22. This configuration assists in keeping the electric field near the gate to drain region low and improves reliability performance of transistor 90. This also reduces the gate resistance of transistor 90.

Figure 10:
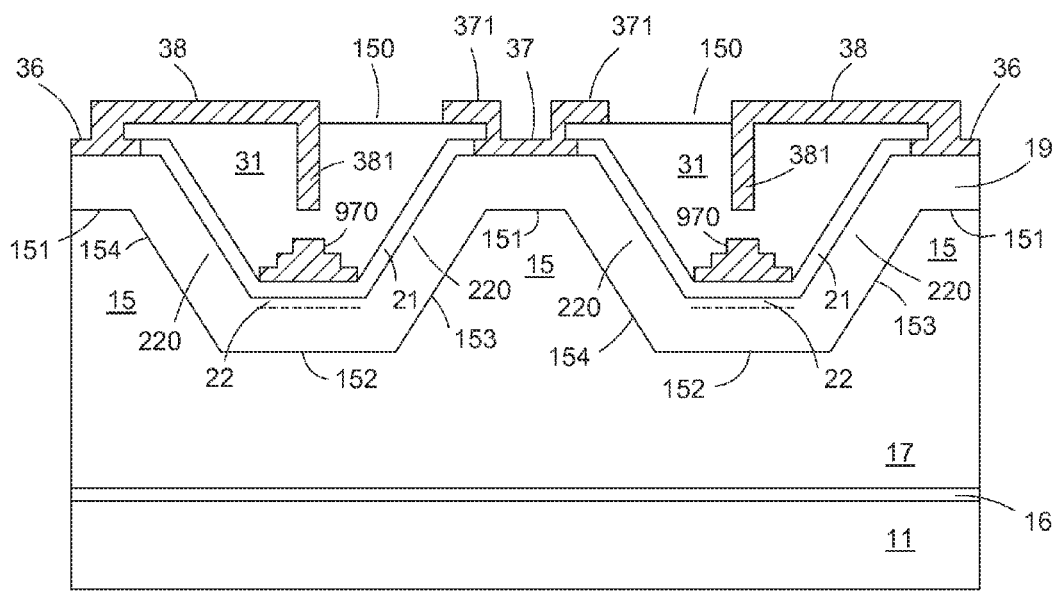

FIG. 10 illustrates an enlarged cross-sectional view of an example of a portion of an embodiment of a semiconductor device, such as HEMT 100, which is an alternate embodiment of transistors 70-90. Transistor 100 is similar to transistor 90, but transistor 100 includes a buffer layer 17 similar to transistor 80 with trenches 150 formed in buffer layer 17 before channel layer 19 and barrier layer 21 are formed.

Figure 11:
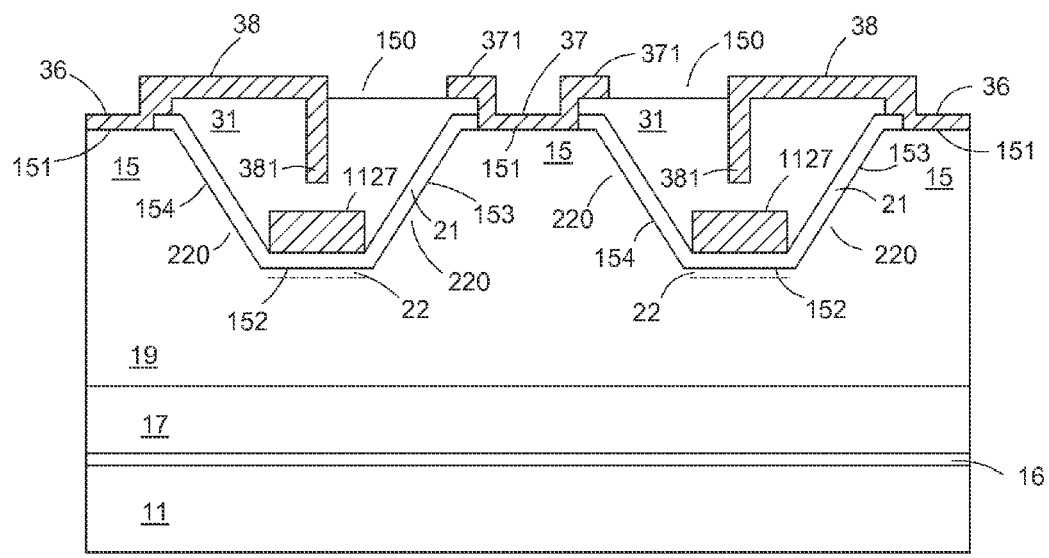

FIG. 11 illustrates an enlarged cross-sectional view of an example of a portion of an embodiment of a semiconductor device, such as HEMT 110, which is an alternate embodiment of transistors 70-100. Transistor 110 is similar to transistors 70-80, but transistor 110 includes a thicker gate conductor 1127 compared to, for example, gate conductor 27 in transistors 75-80. Because of the angled trench sidewalls 153 and 154, thicker gate conductor 927 functions similarly to a stepped gate field plate as in transistors 90 and 100. This assists in keeping the electric field near the gate to drain region low and thus, improves the reliability performance of transistor 110. This also reduces the gate resistance of transistor 110.

Figure 12:
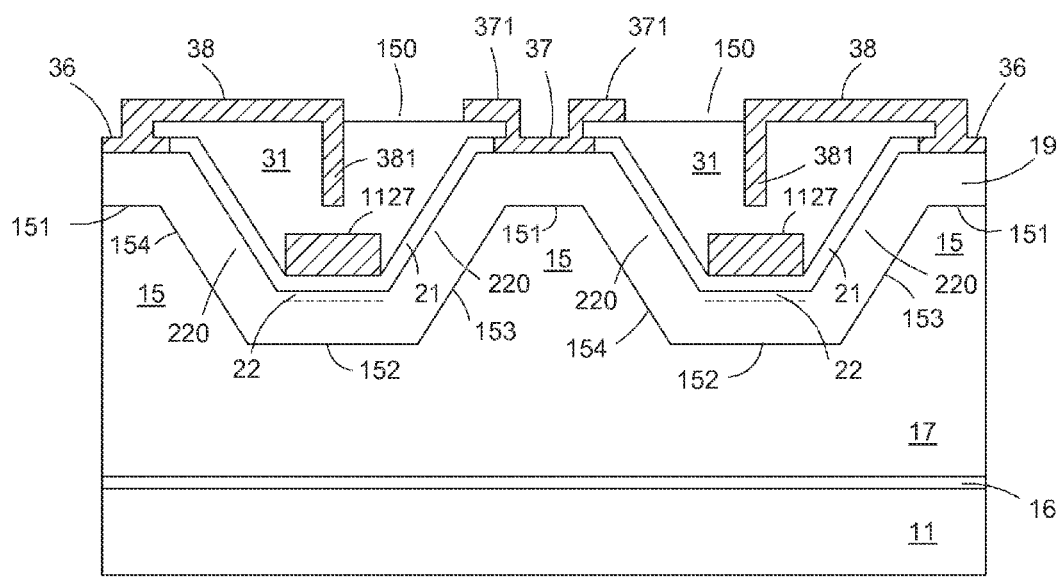

FIG. 12 illustrates an enlarged cross-sectional view of an example of a portion of an embodiment of a semiconductor device, such as HEMT 120, which is an alternate embodiment of transistors 70-110. Transistor 120 is similar to transistor 110, but transistor 120 includes a buffer layer 17 similar to transistors 80 and 100 with trenches 150 formed in buffer layer 17 before channel layer 19 and barrier layer 21 are formed.

Figure 13:
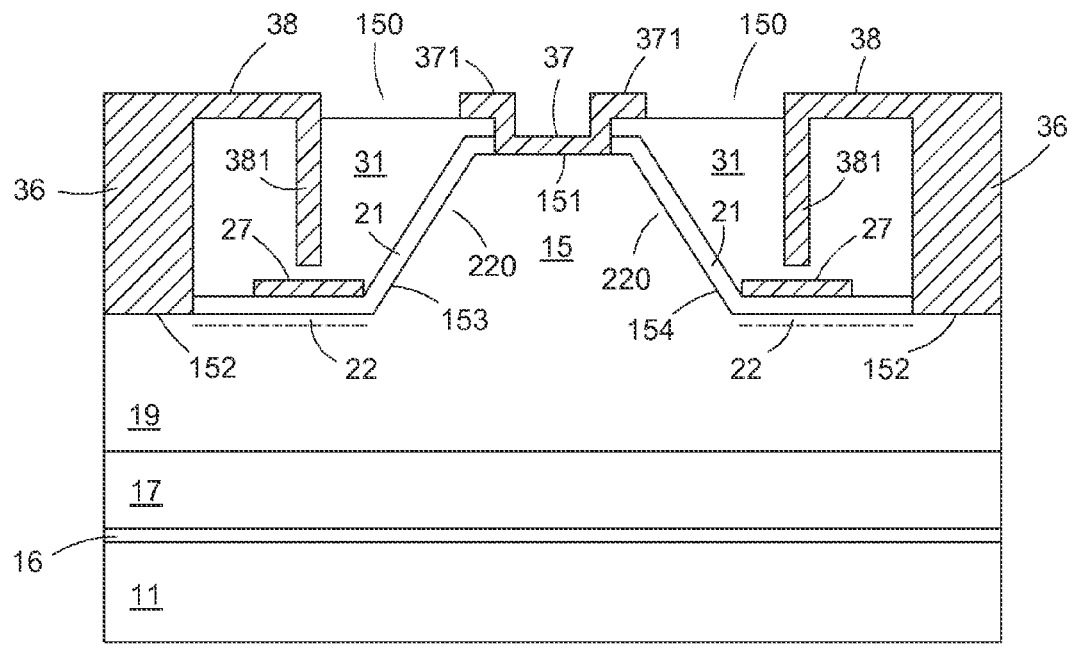

FIG. 13 illustrates an enlarged cross-sectional view of an example of a portion of an embodiment of a semiconductor device, such as HEMT 130, which is an alternate embodiment of transistors 70-120. Transistor 130 is similar to transistor 70, but transistor 130 includes a reduced gate to source distance configuration. In one embodiment, transistor 130 places source electrodes 36 proximate to 2DEG region 22 along recessed surface portions 152 of trenches 150. In some embodiments, transistor 130 can also include an increased gate to drain distance, which increases the breakdown voltage of transistor 130. In one embodiment, this can be achieved by increasing the depth of trenches 150. With the increase in the gate to drain distance, the distance between the gate to source would also increase in embodiments like transistor 70. This would add to the access region resistance of such configurations, which can be reduced as in transistor 130 by etching the source side of the device closer to the gate or all the way to proximate 2DEG region 22 as generally illustrated in FIG. 13.

Figure 14:
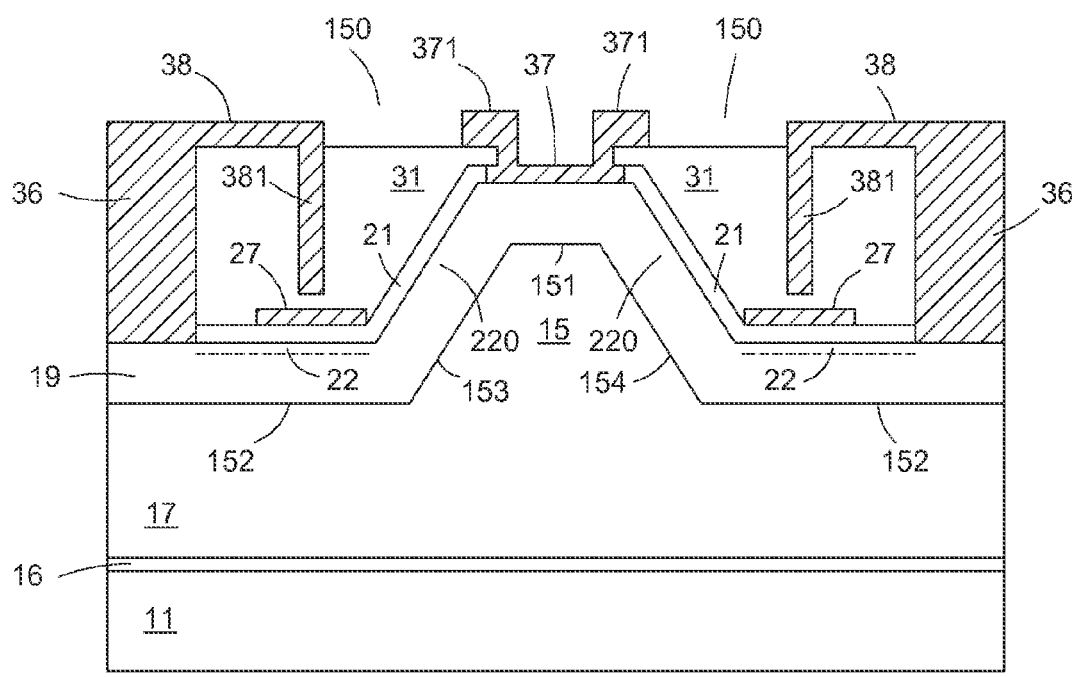

FIG. 14 illustrates an enlarged cross-sectional view of an example of a portion of an embodiment of a semiconductor device, such as HEMT 140, which is an alternate embodiment of transistors 70-130. Transistor 140 is similar to transistors 130, but transistor 140 includes a buffer layer 17 similar to transistor 120 with trenches 150 formed in buffer layer 17 before channel layer 19 and barrier layer 21 are formed.

Figure 15:
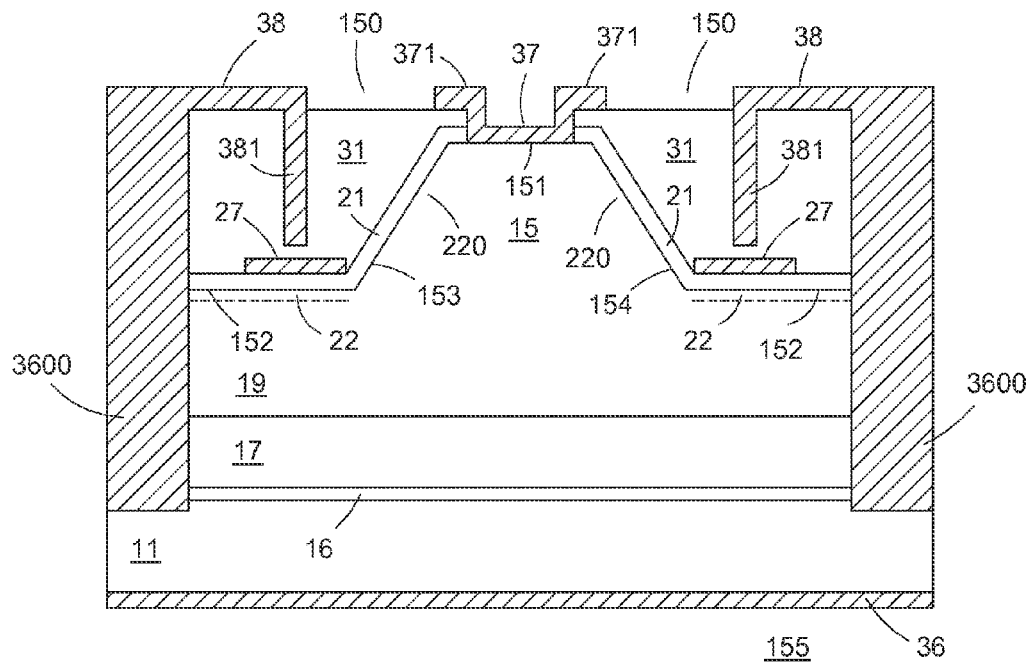

FIG. 15 illustrates an enlarged cross-sectional view of an example of a portion of an embodiment of a semiconductor device, such as HEMT 155, which is an alternate embodiment of transistors 70-140. Transistor 155 is configured to have reduced source inductance and to facilitate the integration of transistor 155 with similar or other transistors (for example, silicon MOSFET devices) for applications such as power supply controllers. Transistor 155 is similar to transistor 140, but transistor 155 includes a source region 3600 that is etched all the way to substrate 11 and source electrode 36 is formed on the back surface of transistor 155. By way of example, anisotropic etch techniques can be used to form vias through the heterostructure to substrate 11 and then source region 3600 can be deposited into the vias. In some embodiments, a conductive layer 36 is formed on the back surface of substrate 11 and can be any suitable conductive material including but not limited to titanium/nickel/silver, chrome/nickel/gold, or other conductive materials. The configuration of transistor 155 helps reduce the source inductance of the device, which helps in improving signal quality and/or efficiency in switching applications. Isolation can be provided from the source conductor to the buffer regions if necessary by placing an insulating layer between source region 3600 and portions of the heterostructure (below 2DEG region 22). This configuration also helps in integrating the transistor 155 with silicon MOSFET devices in switching applications, such as cascode configurations. Also, this configuration improves efficiency and/or signal quality in buck converter configurations.

Figure 16:
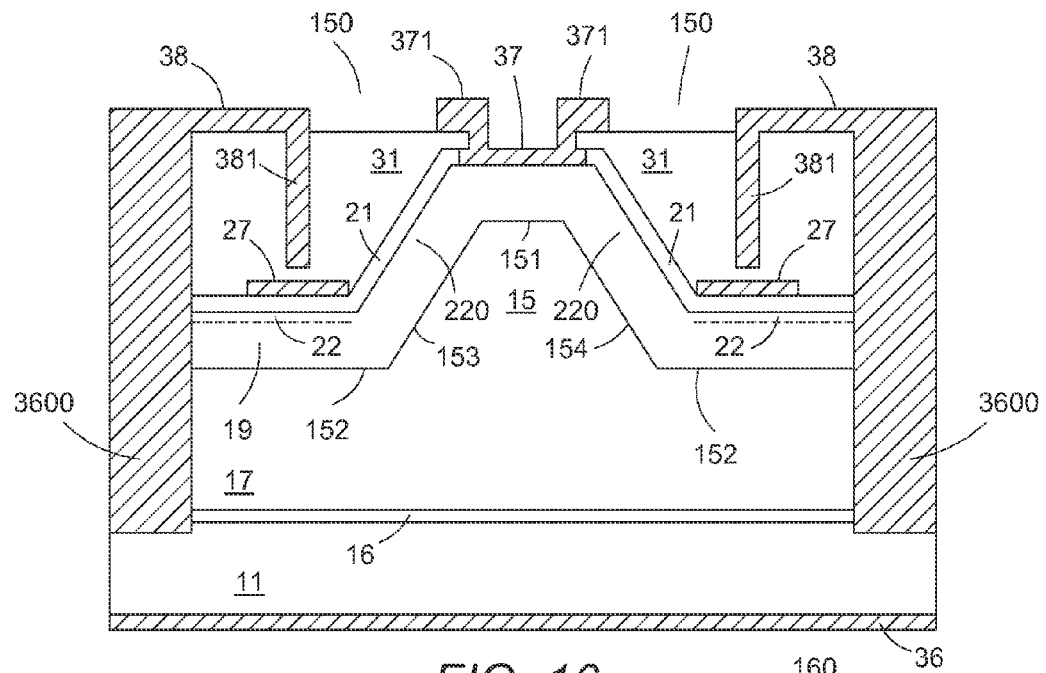

FIG. 16 illustrates an enlarged cross-sectional view of an example of a portion of an embodiment of a semiconductor device, such as HEMT 160, which is an alternate embodiment of transistors 70-155. Transistor 160 is similar to transistor 155, but transistor 160 includes a buffer layer 17 similar to transistor 100 with trenches 150 formed in buffer layer 17 before channel layer 19 and barrier layer 21 are formed.

Figure 17:
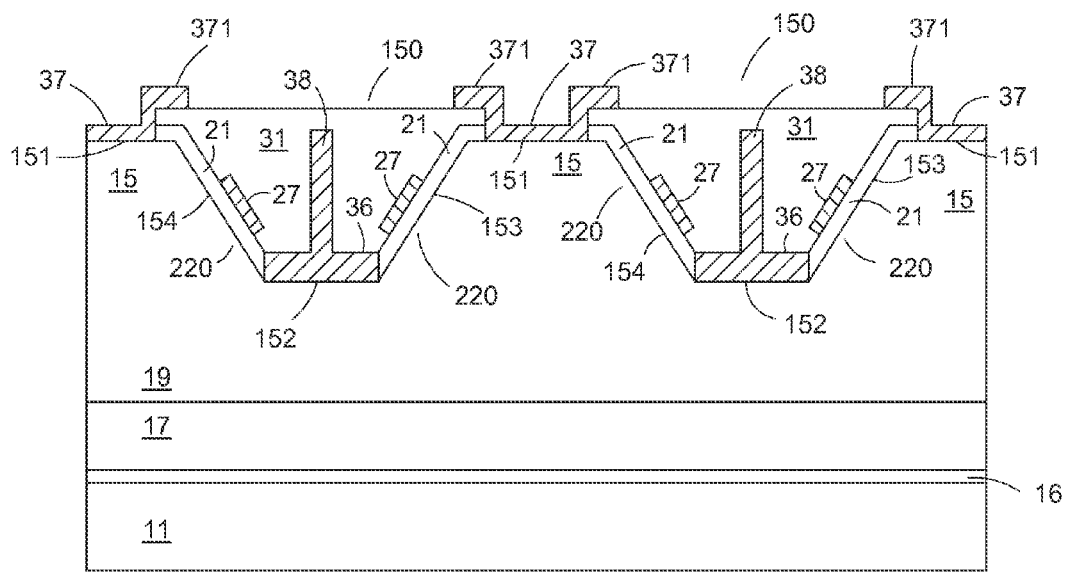

FIG. 17 illustrates an enlarged cross-sectional view of an example of a portion of an embodiment of a semiconductor device, such as HEMT 170, which is an alternate embodiment of transistors 70-160. Transistor 170 is similar to transistors 70-160, but transistor 170 includes drain electrodes 37 at the top of the device and source electrodes 36 at recessed surface portions 152 of trenches 150. The configuration of transistor 170 provides an even smaller pitch compared to transistors 70 or 130, which further helps in reducing the die cost. In transistor 170, gate electrode 27 is formed along the sloped sidewall surfaces 153 and 154 of trenches 150, which places the gate structure at an angle/vertical and therefore results in an angled/vertical gate controlled channel (that is, 2DEG region 220). Shield conductor 38 is formed on source electrode 36 and is present on both sides of drain electrodes 37, which reduces the electric field similar to transistor 70.

In accordance with the present embodiment, shield conductor layer 38 is embedded into or within insulating layers 31 and within trenches 150. Since these structures can be used in high breakdown voltage applications, the separation between shield conductor 38 and drain electrodes 37 should be large enough to support the breakdown voltage of transistor 170. By having this feature of shield conductor layers 38 embedded in trenches 150, the spacing between shield conductor layers 38 and drain electrodes 37 can be maintained vertically instead of on the horizontal surface of the device. Insulating layer 31 is formed in the opening of trenches 150 and between gate electrode 27 and shield conductor layers 38. This configuration consumes less die space and thus further reduces die costs. Additional layers may also be formed under gate electrode 27 such as a cap layer or gate dielectric layer. The cap layer can be GaN, silicon nitride, aluminum nitride, aluminum oxide, a silicon oxide or combinations thereof, hafnium oxide, or other materials as known to those of ordinary skill in the art.

Figure 18:
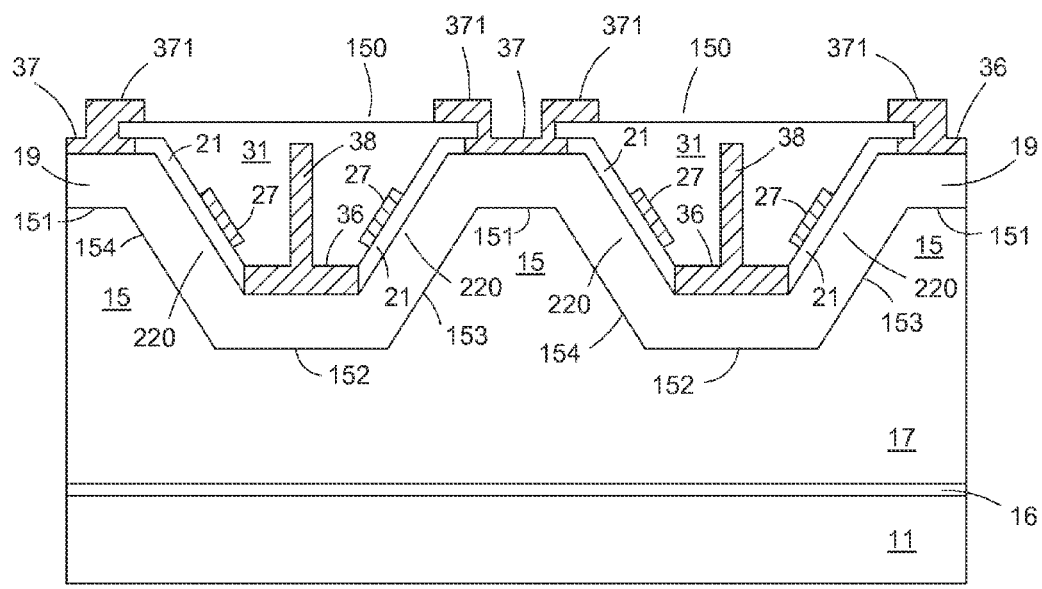

FIG. 18 illustrates an enlarged cross-sectional view of an example of a portion of an embodiment of a semiconductor device, such as HEMT 180, which may be an alternate embodiment of transistors 70-170. Transistor 180 is similar to transistors 170, but transistor 170 includes a buffer layer 17 similar to transistor 100 with trenches 150 formed in buffer layer 17 before channel layer 19 and barrier layer 21 are formed.

Figure 19:
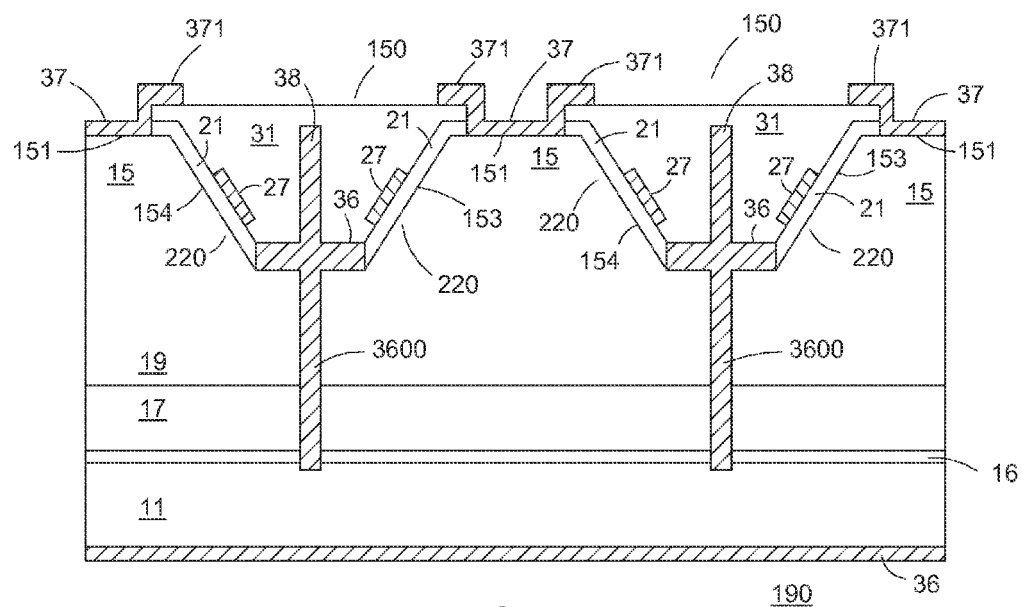

FIG. 19 illustrates an enlarged cross-sectional view of an example of a portion of an embodiment of a semiconductor device, such as HEMT 190, which is an alternate embodiment of transistors 70-180. Transistor 190 is similar to transistor 180, but transistor 190 includes a source conductor 3600 that extends through channel layer 19 and buffers layer 17 to make electrical connection to substrate 11. In some embodiments, substrate 11 can be GaN in this configuration. In transistor 190, source electrode 36 is formed on back surface of substrate 11 similar to transistors 155 and 160. Transistor 190 has a smaller pitch for the same breakdown voltage similar to transistor 155. Isolation can be provided from source conductor 3600 to buffer layer 17 as necessary. For example, source conductor 3600 can be formed in a trench or via having sidewall lined with an insulating material below 2DEG region 20.

Figure 20:
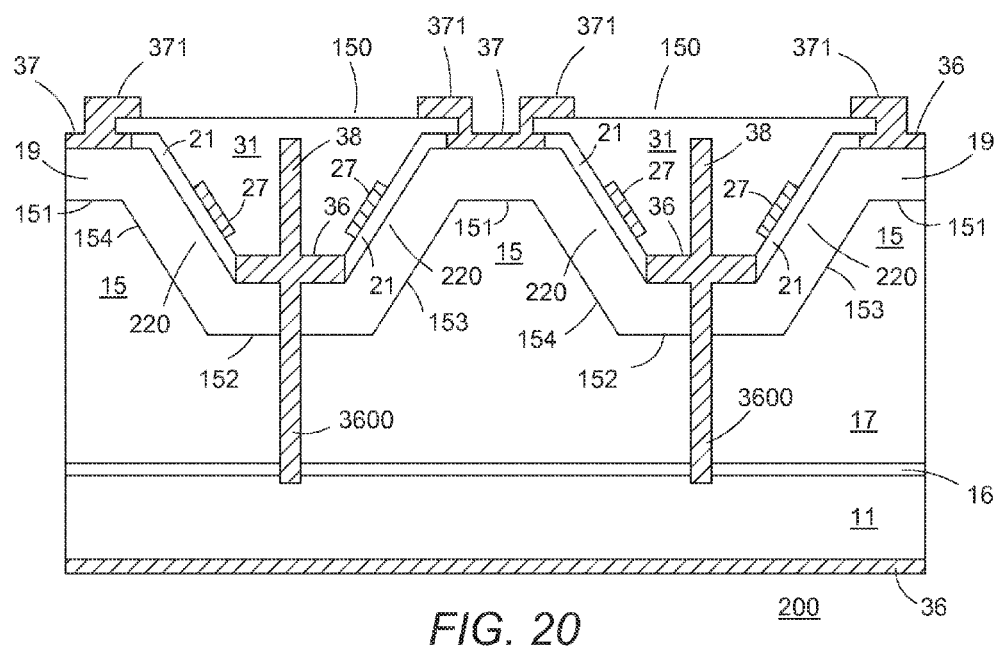

FIG. 20 illustrates an enlarged cross-sectional view of an example of a portion of an embodiment of a semiconductor device, such as HEMT 200, which is an alternate embodiment of transistors 70-190. Transistor 200 is similar to transistor 190, but transistor 200 includes a buffer layer 17 similar to transistor 100 with trenches 150 formed in buffer layer 17 before channel layer 19 and barrier layer 21 are formed.

Figure 21:
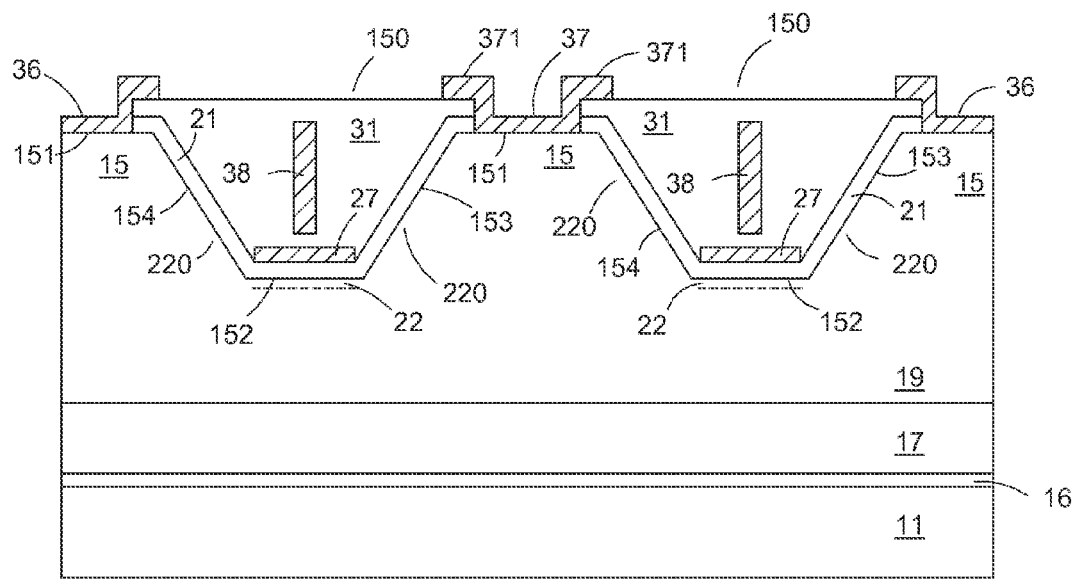

FIG. 21 illustrates an enlarged cross-sectional view of an example of a portion of an embodiment of a semiconductor device, such as HEMT 205, which is an alternate embodiment of transistors 70-200. Transistor 205 includes shield conductor layer 38 formed within the opening or recesses of trenches 150 and overlying gate electrodes 27 and formed further with the insulating layer 31 between shield conductor layer 38 and gate electrodes 27. Forming shield conductor layer 38 embedded in trenches 150 assists in reducing the pitch of transistor 205 similar to transistor 170.

Figure 22:
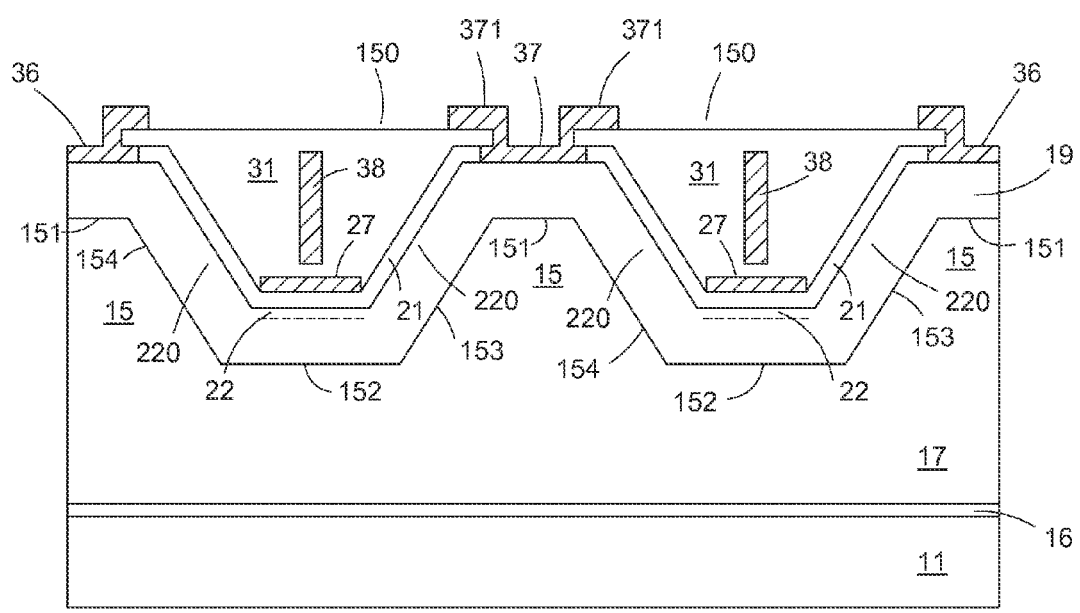

FIG. 22 illustrates an enlarged cross-sectional view of an example of a portion of an embodiment of a semiconductor device, such as HEMT 225, which is an alternate embodiment of transistors 70-205. Transistor 225 is similar to transistor 205 and also includes a buffer layer 17 similar to transistor 100 with trenches 150 formed in buffer layer 17 before channel layer 19 and barrier layer 21 are formed.

Figure 23:
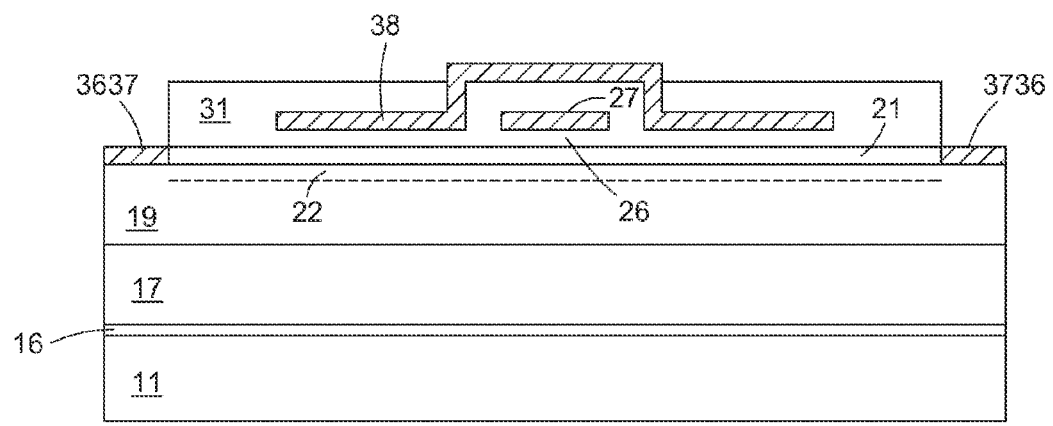

FIG. 23 illustrates an enlarged cross-sectional view of an example of a portion of an embodiment of a semiconductor device, such as HEMT 235, which is an alternate embodiment of transistors 70-225. Transistor 235 is formed as a bi-directional transistor that can support current flow in either direction through transistor 235. Since transistor 235 is bi-directional, the current carrying electrode that functions as the drain or source depends on the bias voltage applied to transistor 235. This is illustrated by the labeling of the current carrying electrodes as 3637 and 3736. Transistor 235 is formed with current carrying electrodes 3637 and 3736 on either side of the gate structure (that is, gate electrode 27 and gate dielectric layer 26; or gate electrode 27 absent gate dielectric layer 26). The current carrying electrodes can be formed to have symmetrical breakdown voltage characteristics such as blocking the same amount of voltage on both sides of the gate structure. The potential and the electric field profile in both of these regions can be similar in this configuration. In other embodiments, the two regions can be formed to be dissimilar to support different breakdown voltages in which case the gate-to-drain distance on either side of the gate structure would be different. In some embodiments, shield conductor layer 38 is switched between electrically connected to the first or second current carrying electrode (3637 or 3736 whichever is the source for that bias voltage) using an external MOSFET, which can depend upon the direction of current flow or on the voltage blocking. In some embodiments, shield conductor layer 38 can be electrically connected to external transistors to perform the switching connection to the different current carrying electrodes such as to 3637 and/or 3736.

Figure 24:
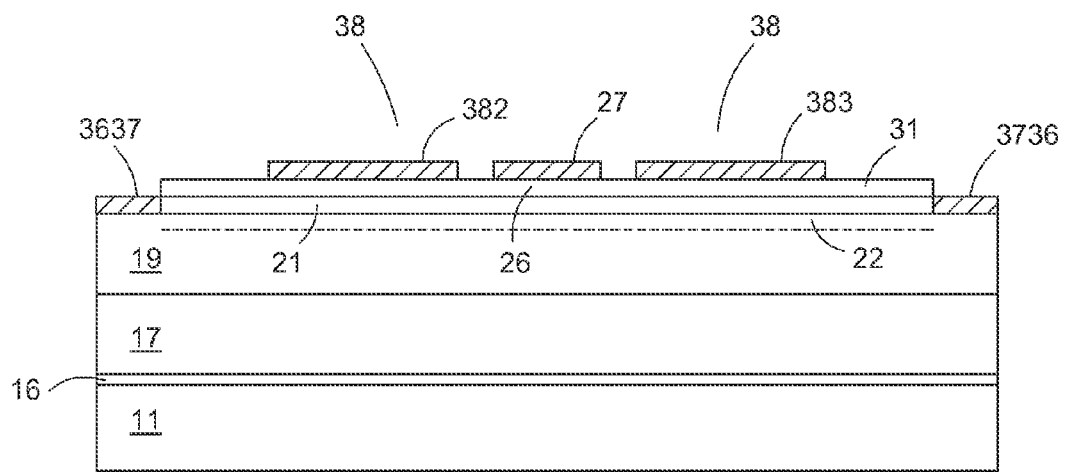

FIG. 24 illustrates an enlarged cross-sectional view of an example of a portion of an embodiment of a semiconductor device, such as HEMT 245, which is an alternate embodiment of transistors 70-235. Transistor 245 is similar to transistor 235 except that shield conductor layer 38 is separated into two or more portions 382 and 383 so that shield portion 382 and shield portion 382 can be separately connected. In some embodiments, shield portions 382 and 383 can be connected electrically or at the ends of the structure, which would be into/out of the page of FIG. 24. The shield electrodes also may be switched between 3637 or 3736 (whichever is the source terminal) using, for example, an external transistor.

Figure 25:
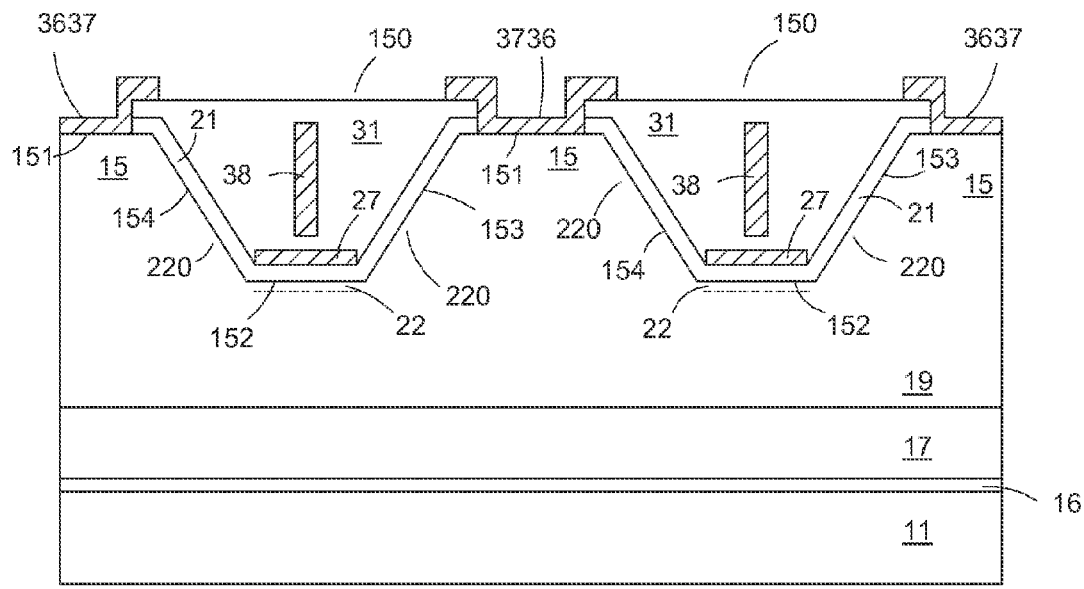

FIG. 25 illustrates an enlarged cross-sectional view of an example of a portion of an embodiment of a semiconductor device, such as HEMT 255, which is an alternate embodiment of transistors 70-245. Transistor 255 is configured as a vertical bi-directional transistor. In some embodiments, shield conducting layers 38 can be electrically connected to external transistors to switch the connection of shield conductor layers 38 to the different current carrying electrodes such as to electrode 3637 and/or electrode 3736. The current carrying electrodes 3637 and 3736 can be formed on either side of the gate structure such that the controlled current flow is lateral through the 2DEG region 22. In transistor 255, the source and drain regions can be made symmetrical. For example, the source and drain regions can be configured to have the same doping concentrations and profiles such that transistor 255 can block the same amount of voltage on both sides of the gate structure. The potential and the electric field profile in both the source and drain regions could be similar in this configuration.

Figure 26:
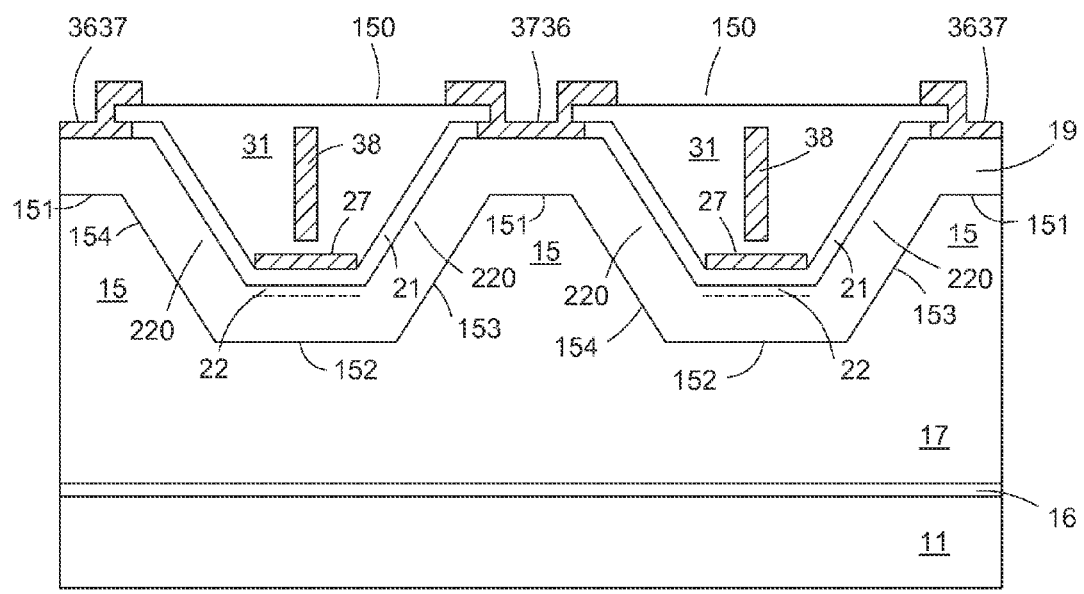

FIG. 26 illustrates an enlarged cross-sectional view of an example of a portion of an embodiment of a semiconductor device, such as HEMT 265, which is an alternate embodiment of transistors 70-255. Transistor 265 may be similar to transistor 255 and includes a buffer layer 17 similar to transistor 100 with trenches 150 formed in buffer layer 17 before channel layer 19 and barrier layer 21 are formed.

Figure 27:
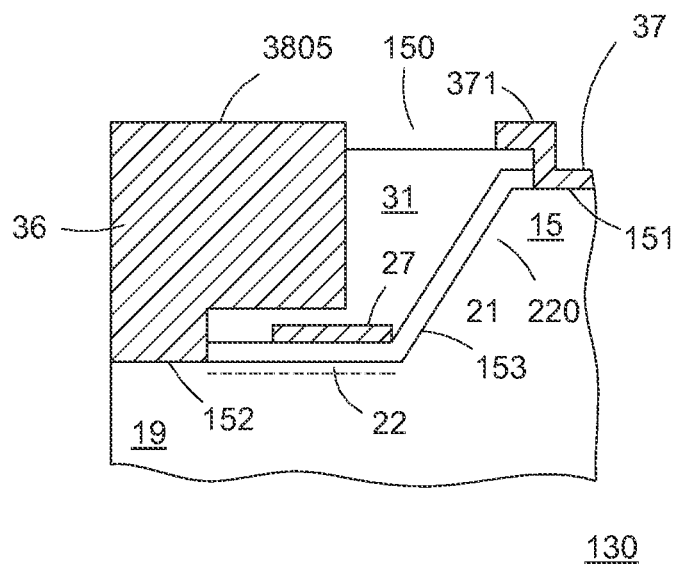
FIGS. 27-29 illustrate enlarged partial cross-sectional views of alternative shield electrode configurations in accordance with embodiments of the present invention.

FIG. 27 illustrates an enlarged partial cross-sectional view of, for example, HEMT 130 with a differently configured shield conducting structure 3805, which replaces at least portions of insulating layer 31 from between source electrode 36 and portion 381 of shield conductor layer 38 with additional conductive material. Shield conducting structure 3805 has a block or thick shape compared to the embodiment of FIG. 13. This configuration provides a larger source metal volume, which can reduce electro-migration problems. This configuration also reduces shield electrode resistance and reduces source metal resistance. These features improve, among other things, switching performance.

Figure 28:
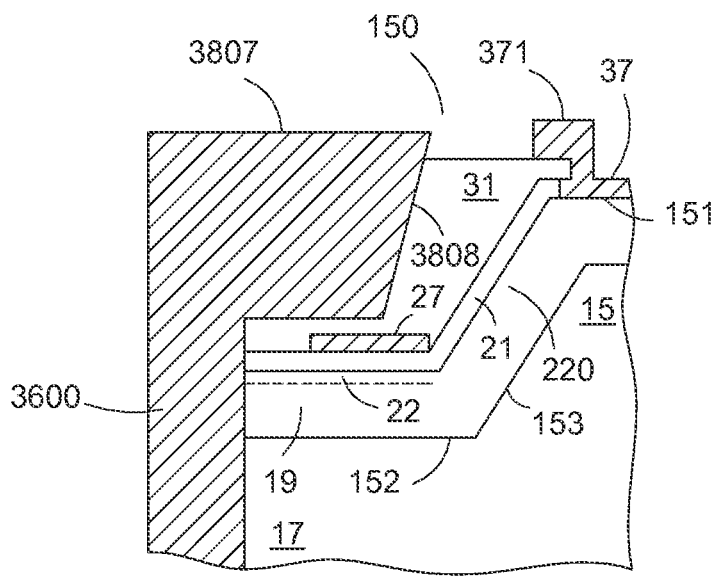

FIG. 28 illustrates an enlarged partial cross-sectional view of, for example, HEMT 140 with a differently configured shield conductor structure 3807, which replaces at least portions of insulating layer 31 from between source electrode 3600 and portion 381 of shield conductor layer 38 with additional conductive material. Shield conducting structure 3808 has a block or thick shape compared to the embodiment of FIG. 14. In some embodiments, shield conducting structure 3807 can include an edge 3808 proximate to the drain side of HEMT device 140 that is sloped or angled. In some embodiments, edge 3808 can be generally parallel to sidewall surface 153. In other embodiments, edge 3808 can be configured to have a steeper slope than sidewall surface 153. In some embodiments, edge 3808 can be configured to have a stepped profile, such as edge 3811 illustrated in FIG. 29. This configuration provides a larger source metal volume, which can reduce electro-migration problems. This configuration also reduces shield electrode resistance and reduces source metal resistance. These features improve, among other things, switching performance.

Figure 29:
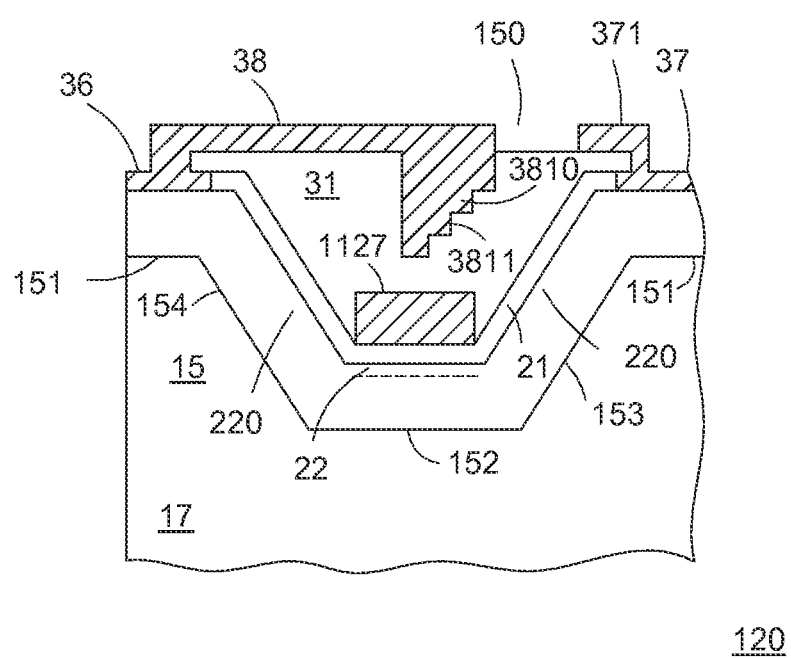

FIG. 29 illustrates an enlarged partial cross-sectional view of, for example, HEMT 120 with a differently configured shield conductor structure 3810 that includes an edge 3811 proximate to drain electrode 37 that has a stepped profile. In one embodiments, the stepped profile is narrower adjacent the gate electrode and gradually gets wider moving vertically away from the gate electrode. The stepped profile provides configurable electric field control. In other embodiments, edge 3811 can have an angled profile similar to edge 3808 illustrated in FIG. 28. In some embodiments the angled profile can be generally parallel to sidewall surface 153. In other embodiments, the angled profile can have a steeper slope than sidewall surface 153. In further embodiments, the stepped configuration of edge 3811 can be reversed with the wider portion adjacent the gate electrode and stepping inward moving vertically away from the gate electrode so that a narrower portion is proximate to the top portion of trench 150.

Alternative shield conductor structures 3805, 3807, and 3810 can have any suitable shape that helps reduce electric field effects. Also, it is understood that shield conductor structures 3805, 3807, and 3810 can be included in the other embodiments described herein as well as others.

In some embodiments, the sidewalls illustrated herein can be any polar/semi-polar surface. In such embodiments, the sloped sidewalls of the trenches can be used to form the polar/semi-polar surface. The semiconductor devices described herein can be depletion (D-mode), enhancement (E-mode), or a combination of these devices may be created by layer stacking and selective etching, or p-type doping in the top layers, or by the addition of dielectric layers such as hafnium oxide, aluminum oxide, and other materials, in conjunction with selective etching processes. It is understood that the current carrying electrodes may make ohmic contact proximate the 2DEG region either by contact to the barrier layer and/or the channel layer.

Those skilled in the art will appreciate that in one embodiment, a semiconductor structure comprises a substrate (for example, element 11) of a first material type, the substrate having a first surface and a second surface. A first semiconductor region (for example, element 17, 19) of a Group III-nitride material on the first surface of the substrate and including a first fin structure (for example, element 15), the first fin structure comprising a generally horizontal first top surface (for example, element 151), a recessed surface portion (for example, element 152) adjacent the first top surface, and first sidewall surfaces (for example, element 153, 154) extending between the recessed surface portion and the first top surface, the first sidewall surfaces being sloped so that a base portion (for example, element 159) of the first fin structure is wider than the first top surface. A second semiconductor region (for example, element 19, 21) of a Group III-nitride material is on the first semiconductor region. A gate conductor (for example, element 27, 970, 1127) overlying at least part of the recessed surface portion. A first current carrying electrode (for example, element 36, 37, 3600, 3637, 3736) is electrically coupled to the second semiconductor region along at least the first top surface. A shield conductor (for example, element 38, 381) is above and insulated from the gate conductor.

Those skilled in the art will also appreciate that according to another embodiment, the structure can further comprise a second current carrying electrode (for example, element 36, 37, 3600, 3637, 3736) electrically coupled to the second semiconductor region at least along the first top surface and spaced apart from the first current carrying electrode, wherein the gate conductor further overlies the first top surface between the first and second current carrying electrodes; and the shield conductor laterally extends between the gate conductor and the first current carrying electrode and further laterally extends proximate to the second current carrying electrode.

Those skilled in the art will also appreciate that according to another embodiment, the first semiconductor region can further include a second fin structure, the second fin structure having a generally horizontal second top surface and second sidewall surfaces extending between second top surface and the recessed surface portion; and a second current carrying electrode electrically coupled to the second semiconductor region along at least the second top surface.

Those skilled in the art will also appreciate that according to another embodiment, the structure can further include a second current carrying electrode on the second surface of the substrate.

Those skilled in the art will also appreciate that according to another embodiment, the first sidewall surfaces can be semi-polar (for example, element 220).

Those skilled in the art will also appreciate that according to another embodiment, the first sidewall surfaces can be {01$\bar{1}$2} family R-plane surfaces (for example, element 63) and the first top surface can be along a <0001> crystal plane (for example, element 64).

Those skilled in the art will also appreciate that according to another embodiment, the gate conductor can overlie part of the first fin structure and the first current carrying electrode can overlie part of the recessed surface portion.

Those skilled in the art will also appreciate that according to another embodiment, the structure can further comprise a third semiconductor region of a Group III-nitride material type between the first and second semiconductor regions, wherein the first semiconductor region can comprise a buffer region, the third semiconductor region can comprise a GaN channel region, and the second semiconductor region can comprise an AlGaN barrier region, and wherein the first current carrying electrode can contact the AlGaN barrier region, and wherein the substrate can comprise a semiconductor material.

Those skilled in the art will also appreciate that according to another embodiment, the first semiconductor region can comprise a GaN channel region and the second semiconductor region can comprise an AlGaN barrier region.

Those skilled in the art will also appreciate that according to another embodiment, the gate conductor can overlie part the first sidewall surfaces and part of the first top surface; and the first current carrying electrode can overlie another part of the first sidewall surfaces and another part of the recessed surface portion.

Those skilled in the art will also appreciate that according to another embodiment, the first current carrying electrode and the shield conductor can be electrically coupled together.

Those skilled in the art will appreciate that in one embodiment, a semiconductor device structure includes a substrate (for example, element 11) of a first material type, the substrate having a first major surface and a second major surface; a first semiconductor region (for example, element 17, 19) of a second material type on the first major surface of the substrate; a first trench (for example, element 150) extending into the first semiconductor region, the first trench having sidewalls (for example, elements 153, 154) and a bottom surface (for example, element 152); a second semiconductor region (for example, element 19, 21) of a third material type on the first semiconductor region and within the first trench, wherein the second semiconductor region is configured to form a 2DEG region that is semi-polar (for example, element 220) proximate to the sidewalls of the first trench and polar (for example, element 22) proximate to the bottom surface of the first trench; a control electrode (for example, element 27, 970, 1127) within the first trench and configured to control at least a horizontal portion of the 2DEG region; a shield conductor layer (for example, element 38, 381) within the trench and above the control electrode and separated from the control electrode by an insulating layer (for example, element 31); and a first current carrying electrode electrically coupled to 2DEG region (for example, element 36, 37, 3600, 3637, 3736).

Those skilled in the art will also appreciate that according to another embodiment, the first current carrying electrode can be along a <0001> crystal plane (for example, element 64).

Those skilled in the art will also appreciate that according to another embodiment, the first current carrying electrode can be within the first trench.

Those skilled in the art will also appreciate that according to another embodiment, the first current carrying electrode (for example, element 3600) can further extend through the first semiconductor region and to the substrate.

Those skilled in the art will also appreciate that according to another embodiment, the first current carrying electrode can be connected to the shield conductor layer outside of the first trench; and the structure can further comprise a second current carrying electrode electrically coupled to the first and second semiconductor regions outside of the trench.

Those skilled in the art will also appreciate that according to another embodiment, the structure can comprising a third semiconductor region of a fourth material type between the first semiconductor region and the second semiconductor region; the second material type can comprise AlGaN; the third material type can comprise AlGaN; the fourth material type can comprise GaN; and the second semiconductor region can form the 2DEG region with the third semiconductor region.

Those skilled in the art will also appreciate that according to another embodiment, the control electrode can comprise a stepped structure (for example, element 970) configured as a field plate.

Those skilled in the art will also appreciate that according to another embodiment, the shield conductor layer can comprise a stepped structure (for example, element 3811), a sloped structure (for example, element 3808), a block structure (for example, element 3805, 3807), or combinations of two or more of such structures.

Those skilled in the art will also appreciate that in another embodiment, a method of forming a semiconductor device can comprise, providing a substrate (for example, element 11) of a first material type, the substrate having a first major surface and a second major surface, a first semiconductor region (for example, element 17, 19) of a second material type on the first major surface of the substrate, a first trench (for example, element 150) extending into the first semiconductor region, the first trench having sidewalls (for example, element 153, 154) and a bottom surface (for example, element 152), and a second semiconductor region (for example, element 19, 21) of a third material type on the first semiconductor region and with the first trench, wherein the second semiconductor region is configured to form a 2DEG region that is semi-polar (for example, element 220) proximate to the sidewalls of the first trench and polar (for example, element 22) proximate to the bottom surface of the first trench; forming a control electrode (for example, element 27, 970, 1127) within the first trench and configured to control at least a lateral portion of the 2DEG region; forming a shield conductor layer (for example, element 38, 381) within the trench and above the control electrode and separated from the control electrode by a insulating layer (for example, element 31); and forming a first current carrying electrode (for example, element 36, 37, 3600, 3637, 3736) electrically coupled to 2DEG region.

Those skilled in the art will also appreciate that according to other embodiments, the shield conductor layer (for example, element 38, 381, 3805, 3807, 3810) can be configured to have a sloped profile (for example, element 3808), a stepped profile (for example, element 3811), or a block-like shape (for example, element 3805, 3807).

In view of all the above, it is evident that a novel structure and method is disclosed. Included in one embodiment, among other features, is a heterostructure that includes a fin structure. In one embodiment, the fin structure includes a recessed surface region that is configured to provide a 2DEG region that is polar and sidewall surfaces configured to provide a 2DEG region this is semi-polar. In some embodiments a gate structure is provided to control current flow in the polar 2DEG region. In other embodiments, a gate structure is provided to control current flow in the semi-polar 2DEG region. In some embodiments, a gate structure is provided to control current flow in both the polar and semi-polar 2DEG regions. In some embodiments a current carrying electrode is electrically coupled to the 2DEG region on a top surface of the fin structure. In other embodiments, a current carrying electrode is electrically coupled to the 2DEG region proximate to the recessed surface region. In some embodiments, the current carrying electrode extends through the structure and contact is made on a back surface of the base substrate. In other embodiments, bi-directional switches are provided. The embodiments provide, among other things, lower on-resistance, lower cost of manufacture, reduced source inductance, and/or improved structure for integration with other devices.

While the subject matter of the descriptions are described with specific preferred embodiments and example embodiments, the foregoing drawings and descriptions thereof depict only typical and exemplary embodiments of the subject matter and are not therefore to be considered to be limiting of its scope, it is evident that many alternatives and variations will be apparent to those skilled in the art. For clarity of the explanation, the preferred embodiment is explained, however, other embodiments are also possible.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

We claim:

1. A semiconductor structure comprising:
   a substrate of a first material type, the substrate having a first surface and a second surface;
   a first semiconductor region comprising a Group III-nitride material on the first surface of the substrate and including a first fin structure, the first fin structure comprising:
   a generally horizontal first top surface;
   a recessed surface portion adjacent the first top surface; and
   first sidewall surfaces extending between the recessed surface portion and the first top surface, the first sidewall surfaces being sloped so that a base portion of the first fin structure is wider than the first top surface;
   a second semiconductor region comprising a Group III-nitride material disposed over the first fin structure;
   a gate conductor overlying at least part of the recessed surface portion;
   a first current carrying electrode electrically coupled to the second semiconductor region along at least the first top surface; and
   a shield conductor above and insulated from the gate conductor.

2. The structure of claim 1 further comprising:
   a second current carrying electrode electrically coupled to the second semiconductor region at least along the first top surface and spaced apart from the first current carrying electrode, wherein:
   the gate conductor further overlies the first top surface between the first and second current carrying electrodes; and
   the shield conductor laterally extends between the gate conductor and the first current carrying electrode and further laterally extends proximate to the second current carrying electrode.

3. The structure of claim 1, wherein the first semiconductor region includes a second fin structure, the second fin structure having a generally horizontal second top surface and second sidewall surfaces extending between second top surface and the recessed surface portion, and wherein the second semiconductor region is disposed over the second fin structure; and
   a second current carrying electrode electrically coupled to the second semiconductor region along at least the second top surface.

4. The structure of claim 1 further comprising a second current carrying electrode on the second surface of the substrate.

5. The structure of claim 1, wherein the first sidewall surfaces are semi-polar.

6. The structure of claim 5, wherein:
   the first sidewall surfaces are {0112} family R-plane surfaces; and
   the first top surface is along a <0001> crystal plane.

7. The structure of claim 1, wherein:
   the gate conductor overlies part of the first fin structure; and
   the first current carrying electrode overlies part of the recessed surface portion.

8. The structure of claim 1, further comprising a third semiconductor region comprising a Group III-nitride material type between the first and second semiconductor regions, wherein the first semiconductor region comprises a buffer region, the third semiconductor region comprises a GaN channel region, and the second semiconductor region comprises an AlGaN barrier region, and wherein the first current carrying electrode contacts the AlGaN barrier region, and wherein the substrate comprises a semiconductor material.

9. The structure of claim 1, wherein the first semiconductor region comprises a GaN channel region and the second semiconductor region comprises an AlGaN barrier region.

10. The structure of claim 1, wherein:
    the gate conductor overlies part of the first sidewall surfaces and part of the first top surface; and
    the first current carrying electrode overlies another part of the first sidewall surfaces and another part the recessed surface portion.

11. The structure of claim 1, wherein the first current carrying electrode and the shield conductor are electrically coupled together.

12. A semiconductor structure comprising:
    a substrate of a first material type, the substrate having a first surface and a second surface;
    a first semiconductor region comprising a Group III-nitride material on the first surface of the substrate and including a first fin structure, the first fin structure comprising:
    a generally horizontal first top surface;
    a recessed surface portion adjacent the first top surface; and
    first sidewall surfaces extending between the recessed surface portion and the first top surface, the first sidewall surfaces being sloped so that a base portion of the first fin structure is wider than the first top surface;
    a second semiconductor region comprising a Group III-nitride material disposed over the first fin structure;
    a gate conductor overlying at least part of the recessed surface portion;
    a first current carrying electrode electrically coupled to the second semiconductor region along at least the first top surface;
    a second current carrying electrode electrically coupled to the second semiconductor region; and
    a shield conductor above and insulated from the gate conductor.

13. The structure of claim 12, wherein:
    the second current carrying electrode is electrically coupled to the second semiconductor region at least along the first top surface and spaced apart from the first current carrying electrode;
    the gate conductor further overlies the first top surface between the first and second current carrying electrodes; and the shield conductor laterally extends between the gate conductor and the first current carrying electrode and further laterally extends proximate to the second current carrying electrode.

14. The structure of claim 12, wherein:
the first semiconductor region includes a second fin structure, the second fin structure having a generally horizontal second top surface and second sidewall surfaces extending between second top surface and the recessed surface portion, and wherein the second semiconductor region is disposed over the second fin structure; and
the second current carrying electrode is electrically coupled to the second semiconductor region along at least the second top surface.

15. The structure of claim 12, wherein the second current carrying electrode is further electrically coupled to the second surface of the substrate.

16. The structure of claim 12, wherein:
the first sidewall surfaces are $\{01\bar{1}2\}$ family R-plane surfaces; and
the first top surface is along a <0001> crystal plane.

17. A semiconductor structure comprising:
a semiconductor substrate, the semiconductor substrate having a first surface and a second surface;
a first semiconductor region comprising a Group III-nitride material on the first surface of the semiconductor substrate and including a first fin structure, the first fin structure comprising:
a generally horizontal first top surface;
a recessed surface portion adjacent the first top surface; and
first sidewall surfaces extending between the recessed surface portion and the first top surface, the first sidewall surfaces being sloped so that a base portion of the first fin structure is wider than the first top surface;
a second semiconductor region comprising a Group III-nitride material disposed over the first fin structure;
a gate conductor overlying at least part of the recessed surface portion;
a first current carrying electrode electrically coupled to the second semiconductor region along at least the first top surface;
a second current carrying electrode electrically coupled to the second semiconductor region; and
a shield conductor above and insulated from the gate conductor.

18. The structure of claim 17, further comprising a third semiconductor region comprising a Group III-nitride material type between the first and second semiconductor regions, wherein the first semiconductor region comprises a buffer region, the third semiconductor region comprises a GaN channel region, and the second semiconductor region comprises an AlGaN barrier region, and wherein the first current carrying electrode contacts the AlGaN barrier region.

19. The structure of claim 17, wherein:
the gate conductor overlies part of the first sidewall surfaces and part of the first top surface; and
the first current carrying electrode overlies another part of the first sidewall surfaces and another part the recessed surface portion.

20. The structure of claim 17, wherein the first current carrying electrode and the shield conductor are electrically coupled together.

* * * * *